United States Patent
Chen et al.

(10) Patent No.: US 12,094,838 B2
(45) Date of Patent: Sep. 17, 2024

(54) CRACK STOP RING TRENCH TO PREVENT EPITAXY CRACK PROPAGATION

(71) Applicant: Taiwan Semiconductor Manufacturing Company, Ltd., Hsinchu (TW)

(72) Inventors: Jiun-Yu Chen, Hsinchu (TW); Chun-Lin Tsai, Hsin-Chu (TW); Yun-Hsiang Wang, Hsinchu (TW); Chia-Hsun Wu, Hsinchu (TW); Jiun-Lei Yu, Zhudong Township (TW); Po-Chih Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/355,470

(22) Filed: Jul. 20, 2023

(65) Prior Publication Data

US 2023/0369245 A1    Nov. 16, 2023

Related U.S. Application Data

(62) Division of application No. 17/391,341, filed on Aug. 2, 2021, now Pat. No. 11,798,899.
(Continued)

(51) Int. Cl.
*H01L 23/00* (2006.01)
*H01L 23/58* (2006.01)
(Continued)

(52) U.S. Cl.
CPC .......... *H01L 23/562* (2013.01); *H01L 23/585* (2013.01); *H01L 25/0657* (2013.01); *H01L 29/0657* (2013.01); *H01L 2225/06541* (2013.01)

(58) Field of Classification Search
CPC . H01L 23/562; H01L 23/585; H01L 25/0657; H01L 29/2003
See application file for complete search history.

(56) References Cited

U.S. PATENT DOCUMENTS

| 11,233,053 B2 | 1/2022 | Radosavljevic et al. |
| 2013/0189829 A1 | 7/2013 | Mieczkowski et al. |

(Continued)

OTHER PUBLICATIONS

Watanabe et al. "GaN-on-Si Technology for High-power Transistors" NTT Technical Review, vol. 12 No. 4, published Apr. 2014.
(Continued)

*Primary Examiner* — Thao P Le
(74) *Attorney, Agent, or Firm* — Eschweiler & Potashnik, LLC

(57) ABSTRACT

In some embodiments, the present disclosure relates to a semiconductor structure. The semiconductor structure includes a stacked semiconductor substrate having a semiconductor material disposed over a base semiconductor substrate. The base semiconductor substrate has a first coefficient of thermal expansion and the semiconductor material has a second coefficient of thermal expansion that is different than the first coefficient of thermal expansion. The stacked semiconductor substrate includes one or more sidewalls defining a crack stop ring trench that continuously extends in a closed path between a central region of the stacked semiconductor substrate and a peripheral region of the stacked semiconductor substrate surrounding the central region. The peripheral region of the stacked semiconductor substrate includes a plurality of cracks and the central region is substantially devoid of cracks.

20 Claims, 16 Drawing Sheets

Related U.S. Application Data

(60) Provisional application No. 63/190,407, filed on May 19, 2021.

(51) Int. Cl.
    *H01L 25/065*    (2023.01)
    *H01L 29/06*    (2006.01)

(56) References Cited

U.S. PATENT DOCUMENTS

| | | | |
|---|---|---|---|
| 2016/0111501 A1* | 4/2016 | Chen | H01L 23/3171 257/192 |
| 2017/0092777 A1 | 3/2017 | Vielemeyer | |
| 2018/0033682 A1* | 2/2018 | Chern | H01L 27/0605 |
| 2019/0019770 A1 | 1/2019 | Chang et al. | |
| 2020/0365510 A1 | 11/2020 | Lin et al. | |
| 2021/0050482 A1 | 2/2021 | Breva et al. | |
| 2021/0273065 A1* | 9/2021 | Brun | H01L 21/32133 |
| 2021/0320045 A1 | 10/2021 | Hwang et al. | |
| 2022/0223699 A1* | 7/2022 | Brun | H01L 29/401 |
| 2022/0359346 A1* | 11/2022 | Wang | H01L 23/535 |
| 2023/0024248 A1 | 1/2023 | Luo | |
| 2023/0138616 A1 | 5/2023 | Choi et al. | |
| 2023/0343693 A1* | 10/2023 | Wu | H01L 24/25 |
| 2023/0343750 A1* | 10/2023 | Motoyoshi | H01L 23/585 |
| 2023/0408510 A1* | 12/2023 | Goldsmith | G01N 27/4145 |
| 2024/0014176 A1* | 1/2024 | Chang | H01L 23/5226 |
| 2024/0113094 A1* | 4/2024 | West | H01L 24/06 |

OTHER PUBLICATIONS

Notice of Allowance dated Jun. 22, 2023 for U.S. Appl. No. 17/391,341.

* cited by examiner

800 →

900 →

1000 →

US 12,094,838 B2

CRACK STOP RING TRENCH TO PREVENT EPITAXY CRACK PROPAGATION

REFERENCE TO RELATED APPLICATIONS

This Application is a Divisional of U.S. application Ser. No. 17/391,341, filed on Aug. 2, 2021, which claims the benefit of U.S. Provisional Application No. 63/190,407, filed on May 19, 2021. The contents of the above-referenced Patent Applications are hereby incorporated by reference in their entirety.

BACKGROUND

Modern day integrated chips comprise millions or billions of semiconductor devices formed on a semiconductor substrate (e.g., silicon). Semiconductor devices based on silicon, such as transistors and photodiodes, have been a standard in the semiconductor industry for the past four decades. However, semiconductor devices based on alternative materials are receiving increasing attention. For example, semiconductor devices based on group III-N semiconductors, such as gallium nitride (GaN), have found widespread use in high power applications, in optoelectronic applications, in high temperature applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
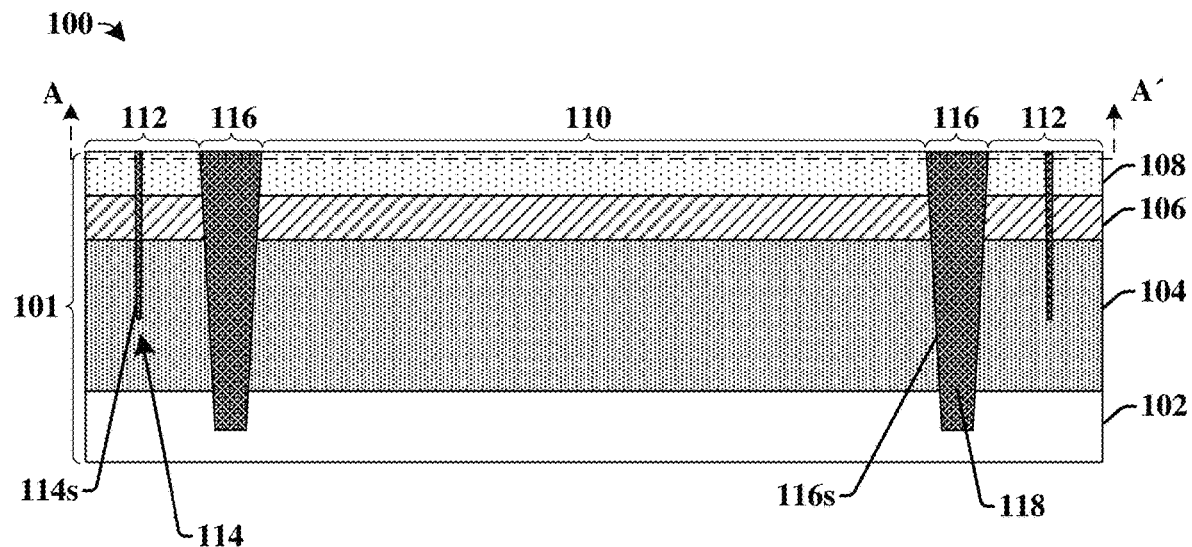
FIGS. 1A-1B illustrate some embodiments of a semiconductor structure comprising a crack stop ring trench configured to mitigate the propagation of cracks within a stacked semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor transistors based on silicon have been widely used in the semiconductor industry for the past four decades. However, as the size of semiconductor components continues to scale (e.g., shrink), it has become increasing difficult to fabricate higher performance transistors on silicon substrates. As the scaling of silicon devices continues to become more difficult, semiconductor devices based on alternative materials are receiving increasing attention. Gallium nitride (GaN) materials are one alternative to silicon materials. GaN devices have a high carrier mobility and a large band gap that provides high voltage and/or high power applications. For example, the higher carrier mobility enables a GaN transistor device to have a smaller physical size for a given on-resistance and/or breakdown voltage than a silicon transistor device.

GaN-on-silicon technology (e.g., forming GaN onto a base silicon substrate) has become an increasingly attractive option for GaN semiconductor devices. Silicon substrates are low cost, available in large diameters, and have well characterized electrical and thermal properties. Therefore, forming GaN onto a silicon substrate allows the resulting stacked semiconductor substrate to be formed at a relatively low cost by using a process that is compatible with those of existing CMOS (complimentary metal-oxide-semiconductor) silicon processes machines and/or processes. However, GaN is typically grown onto an underlying silicon substrate at a relatively high temperature (e.g., greater than or equal to approximately 500° C.). Because GaN has a larger coefficient of thermal expansion (CTE) than silicon (e.g., approximately 54% larger), the stacked semiconductor substrate will bend when cooled to room temperature after forming the GaN. It has been appreciated that when the bending results in a curvature that exceeds a mechanical strength of the stacked semiconductor substrate, cracks will form along outer edges of the stacked semiconductor substrate. The cracks may subsequently propagate throughout the stacked semiconductor substrate during downstream fabrication processes (e.g., thermal anneals). If the cracks reach device regions within the stacked semiconductor substrate, the cracks may negatively impact devices within the device regions. For example, the cracks may cause yield loss, reliability issues, instability of device operation (e.g., high temperature reverse bias (HTRB) burn out), or the like.

The present disclosure, in some embodiments, relates to a semiconductor structure having a crack stop ring trench configured to mitigate the propagation of cracks within a stacked semiconductor substrate. In some embodiments, the semiconductor structure comprises a stacked semiconductor substrate having a group III-N semiconductor disposed over a silicon base semiconductor substrate (e.g., a base silicon substrate). The stacked semiconductor substrate comprises a central region having a plurality of device regions and a peripheral region surrounding the central region. The stacked semiconductor substrate comprises one or more sidewalls defining a crack stop ring trench that continuously extends in a closed path between the central region and the peripheral region. The crack stop etch stop ring is configured to prevent a plurality of cracks within the peripheral region from propagating to the central region, so that the central region is substantially devoid of cracks. By preventing the plurality of cracks from propagating into the central region, the crack stop ring trench is able to prevent cracks from propagating into the device regions, thereby improving yield, reliability, and performance of devices within the device regions.

Figure 1B:
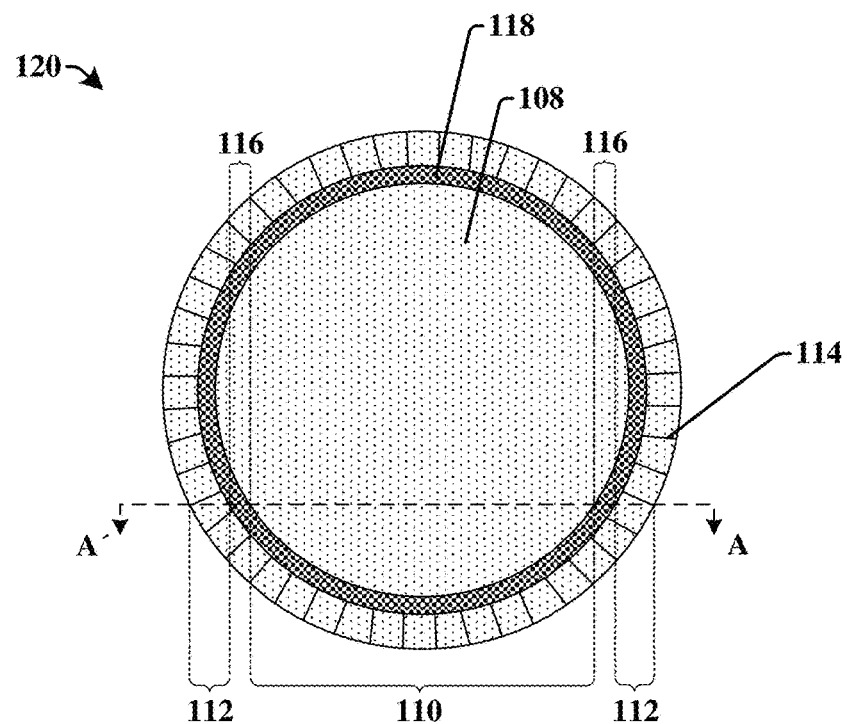

FIGS. 1A-1B illustrate some embodiments of a semiconductor structure 100 comprising a crack stop ring trench configured to mitigate the propagation of cracks within a stacked semiconductor substrate.

As shown in the cross-sectional view of FIG. 1A, the semiconductor structure 100 includes a stacked semiconductor substrate 101 comprising one or more stacked semiconductor materials 104-108 disposed over a base semiconductor substrate 102. In some embodiments, the base semiconductor substrate 102 may comprise or be a first semiconductor material having a first coefficient of thermal expansion (CTE) and the one or more stacked semiconductor materials 104-108 may comprise a second semiconductor material having a second CTE that is different than (e.g., larger than) the first CTE. In some embodiments, the first semiconductor material may also have a first lattice constant that is different than a second lattice constant of the second semiconductor material.

In some embodiments, the one or more stacked semiconductor materials 104-108 may comprise a buffer layer 104 disposed over the base semiconductor substrate 102. In some additional embodiments, the one or more stacked semiconductor materials 104-108 may further comprise a barrier layer 106 disposed over the buffer layer 104, and a doped semiconductor layer 108 disposed over the barrier layer 106. In some embodiments, the base semiconductor substrate 102 may comprise or be a silicon base semiconductor substrate (e.g., a silicon wafer) and the buffer layer 104 may comprise or be a group III-nitride (III-N) semiconductor (e.g., gallium nitride (GaN)). In some additional embodiments, the barrier layer 106 may comprise or be aluminum gallium nitride (AlGaN) and the doped semiconductor layer 108 may comprise or be a doped III-N semiconductor (e.g., GaN doped with a p-type dopant (p-GaN)).

The stacked semiconductor substrate 101 comprises a central region 110 and a peripheral region 112 surrounding the central region 110. The central region 110 comprises one or more device regions configured to have one or more semiconductor devices (e.g., transistor devices, optoelectronic devices, or the like). The peripheral region 112 comprises a plurality of cracks 114 defined by crack sidewalls 114s of the stacked semiconductor substrate 101. The stacked semiconductor substrate 101 further comprises one or more sidewalls 116s defining a crack stop ring trench 116 that extends into the stacked semiconductor substrate 101 between the central region 110 and the peripheral region 112. In some embodiments, the crack stop ring trench 116 may extend from an upper surface of the doped semiconductor layer 108 to within the base semiconductor substrate 102. In some embodiments, one or more dielectric materials 118 may be disposed within the crack stop ring trench 116.

As shown in top-view 120 of FIG. 1B, the crack stop ring trench 116 continuously extends in a first closed path around the central region 110. The peripheral region 112 continuously extends in a second closed path around the crack stop ring trench 116 and along an outermost edge (e.g., outermost perimeter) of the stacked semiconductor substrate 101. The crack stop ring trench 116 laterally separates the plurality of cracks 114 within the peripheral region 112 from the central region 110. In some embodiments, the plurality of cracks 114 continuously extend from the outermost edge of the stacked semiconductor substrate 101 to ends that are separated from the central region 110 by the crack stop ring trench 116. In some embodiments, the plurality of cracks 114 may terminate at and/or within the dielectric material 118.

The crack stop ring trench 116 is configured to stop the plurality of cracks 114 from propagating from the peripheral region 112 to the central region 110, so that the central region 110 is substantially devoid of cracks. By preventing the plurality of cracks 114 from propagating into the central region 110, the crack stop ring trench 116 prevents the plurality of cracks 114 from impacting devices (e.g., transistor devices, photonic devices, or the like) within the central region 110 and causing yield loss, high temperature reverse bias (HTRB), and/or potential reliability issues.

Figure 2A:
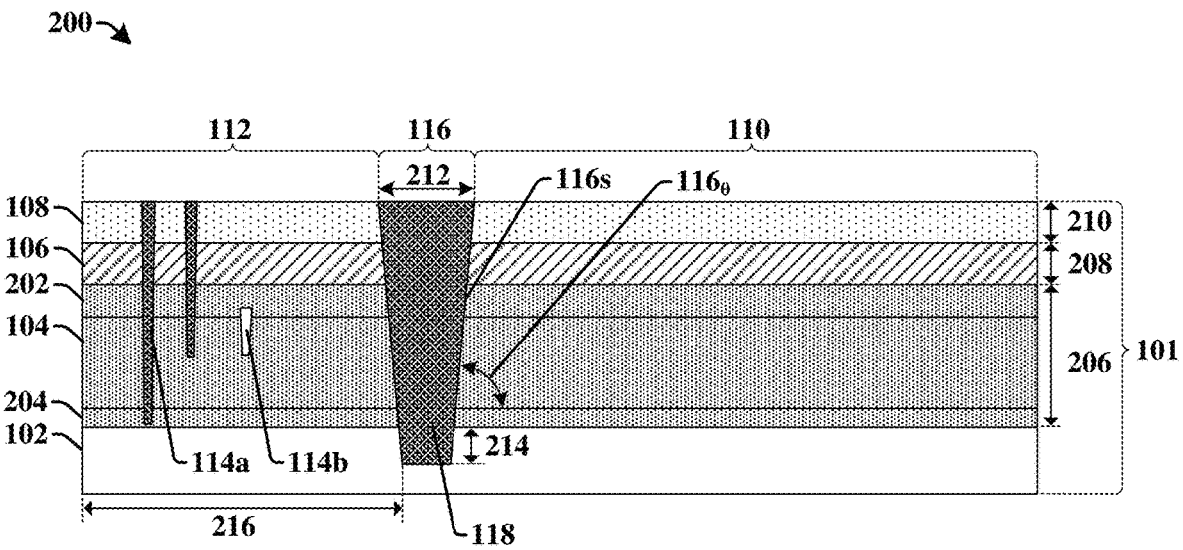
FIGS. 2A-2B illustrate some additional embodiments of a semiconductor structure comprising a crack stop ring trench configured to mitigate the propagation of cracks within a stacked semiconductor substrate.

FIG. 2A illustrates a cross-sectional view of some additional embodiments of a stacked semiconductor substrate 200 comprising a crack stop ring trench configured to mitigate the propagation of cracks within a stacked semiconductor substrate.

The stacked semiconductor substrate 101 comprises a plurality of semiconductor materials disposed over a base semiconductor substrate 102. In some embodiments, the plurality of semiconductor materials may comprise a buffer layer 104 over the base semiconductor substrate 102, an active layer 202 (e.g., a channel layer) over the buffer layer 104, a barrier layer 106 over the active layer 202, and a doped semiconductor layer 108 over the barrier layer 106. In some additional embodiments, the plurality of semiconductor materials may comprise a nucleation layer 204 disposed between the buffer layer 104 and the base semiconductor substrate 102.

In some embodiments, the base semiconductor substrate 102 may comprise or be silicon, the nucleation layer 204 may comprise or be aluminum nitride, the buffer layer 104 may comprise or be gallium nitride, the active layer 202 may comprise or be gallium nitride, the barrier layer 106 may comprise or be aluminum gallium nitride, and the doped semiconductor layer 108 may comprise or be p-doped gallium nitride. In some embodiments, the buffer layer 104 may comprise a dopant species that is configured to improve a performance of overlying devices (e.g., reduce a leakage current within overlying devices). For example, in various embodiments, the buffer layer 104 may comprise a carbon dopant species, an iron dopant species, or the like.

In some embodiments, the buffer layer 104 may have a first thickness 206. The first thickness 206 may be in a range of between approximately 5 nm and approximately 10 microns, between approximately 10 nm and approximately 5 microns, or other similar values. In some embodiments, the barrier layer 106 may have a second thickness 208. The second thickness 208 may be in a range of between approximately 1 nm and approximately 100 nm, between approximately 1 nm and approximately 30 nm, between approximately 10 nm and approximately 30 nm, approximately 20 nm, or other similar values. In some embodiments, the doped semiconductor layer 108 may have a third thickness 210. The third thickness 210 may be in a range of between approximately 1 nm and approximately 100 nm, between approximately 50 nm and approximately 100 nm, between approximately 80 nm and approximately 100 nm, approximately 90 nm, or other similar values.

The stacked semiconductor substrate 101 comprises sidewalls 116s that define a crack stop ring trench 116 disposed between a central region 110 of the stacked semiconductor substrate 101 and a peripheral region 112 of the stacked semiconductor substrate 101. In some embodiments, the sidewalls 116s may be angled at an acute angle 116θ with respect to a bottom of the buffer layer 104, as measured through the buffer layer 104, so that a width 212 of the crack stop ring trench 116 decreases as a depth of the crack stop ring trench 116 increases. In some embodiments, the width 212 of the crack stop ring trench 116 may be in a range of between approximately 3 microns (μm) and approximately 5 μm, between approximately 3 μm and approximately 4 μm, of approximately 3.5 μm, or other similar values. In some embodiments, the crack stop ring trench 116 may be defined by sidewalls of one or more of the base semiconductor substrate 102, the nucleation layer 204, the buffer layer 104, the active layer 202, the barrier layer 106, and/or the doped semiconductor layer 108. In some additional embodiments, the crack stop ring trench 116 may extend a non-zero distance 214 into the base semiconductor substrate 102. In some embodiments, the non-zero distance 214 may be in a range of between approximately 100 nm and approximately 150 nm, between approximately 75 nm and approximately 200 nm, between approximately 50 nm and approximately 250 nm, or other similar values.

In some embodiments, a plurality of cracks 114a-114b are arranged within the peripheral region 112. In some embodiments, the plurality of cracks 114a-114b may comprise a first plurality of cracks 114a that are filled with a dielectric material. In some embodiments, the first plurality of cracks 114a may extend to an uppermost surface of the doped semiconductor layer 108. In some additional embodiments, the plurality of cracks 114a-114b may further comprise a second plurality of cracks 114b that are devoid of a solid material. In some such embodiments, the second plurality of cracks 114b may be filled with a gas and have an upper boundary defined by a lower surface of the stacked semiconductor substrate 101.

In some embodiments, the peripheral region 112 may have a width 216 (e.g., a distance from an outermost perimeter of the stacked semiconductor substrate 101 to the crack stop ring trench 116) of between approximately 2 millimeters (mm) and approximately 5 mm, between approximately 3 mm and approximately 5 mm, between approximately 3 mm and approximately 4 mm, of approximately 3.5 mm, of approximately 3.4 mm, or other similar values. In some embodiments, a distance from a sidewall of the stacked semiconductor substrate 101 to the corresponding outer sidewall of the crack stop ring trench 116 may be adjusted or varied according to the positions of the cracks 114 on one wafer, and may be no less than the distance from the sidewall of the stacked semiconductor substrate 101 to the corresponding inner terminal of corresponding cracks 114. The crack stop ring trench 116 may separate the cracks 114 from device regions in advance.

Figure 2B:
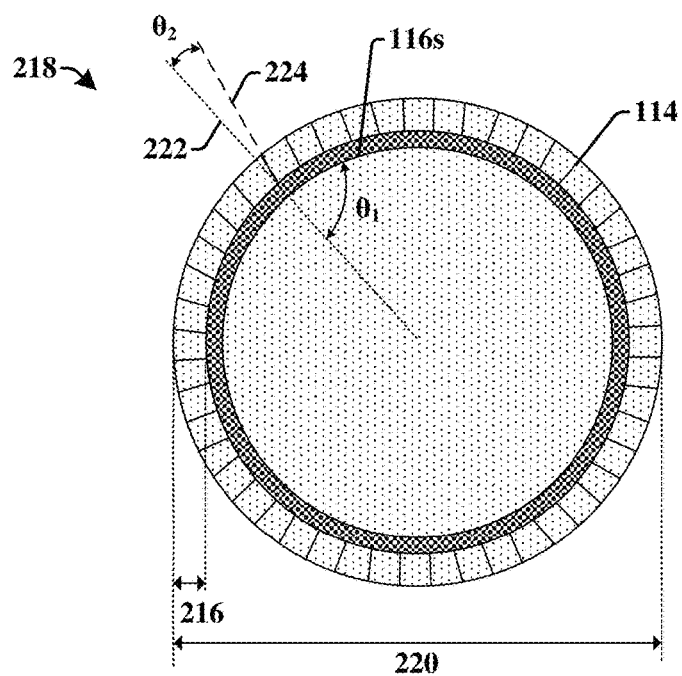

As shown in top-view 218 of FIG. 2B, in some embodiments the width 216 of the peripheral region 112 (e.g., measured along a straight line extending through a center of the stacked semiconductor substrate 101) may between approximately 1% and approximately 3% of a diameter 220 of the stacked semiconductor substrate 101. In other embodiments the width 216 of the peripheral region 112 may between approximately 2% and approximately 5% of a diameter 220 of the stacked semiconductor substrate 101.

In some embodiments, the crack stop ring trench 116 may comprise a substantially circular trench. In other embodiments, the crack stop ring trench 116 may comprise a substantially square shaped trench, a substantially polygonal shaped trench, or the like. In some embodiments, the plurality of cracks 114 may extend partially through a dielectric material 118 within the crack stop ring trench 116. For example, in some embodiments the plurality of cracks 114 may extend into the dielectric material 118 to a range of between approximately 0% and 90% of the width (e.g., 212 of FIG. 2A) of the crack stop ring trench 116.

In some embodiments, a first angle $\theta_1$ may separate a first line 222 extending along a diameter of the stacked semiconductor substrate 101 and a sidewall 116s of the stacked semiconductor substrate 101 forming the crack stop ring trench 116. In some embodiments a second angle $\theta_2$ may separate the first line 222 extending along the diameter of the stacked semiconductor substrate 101 and a second line 224 extending along a crack, of the plurality of cracks 114, which is nearest to the first line 222. In some embodiments, the first angle $\theta_1$ may be larger than the second angle $\theta_2$.

Figure 3A:
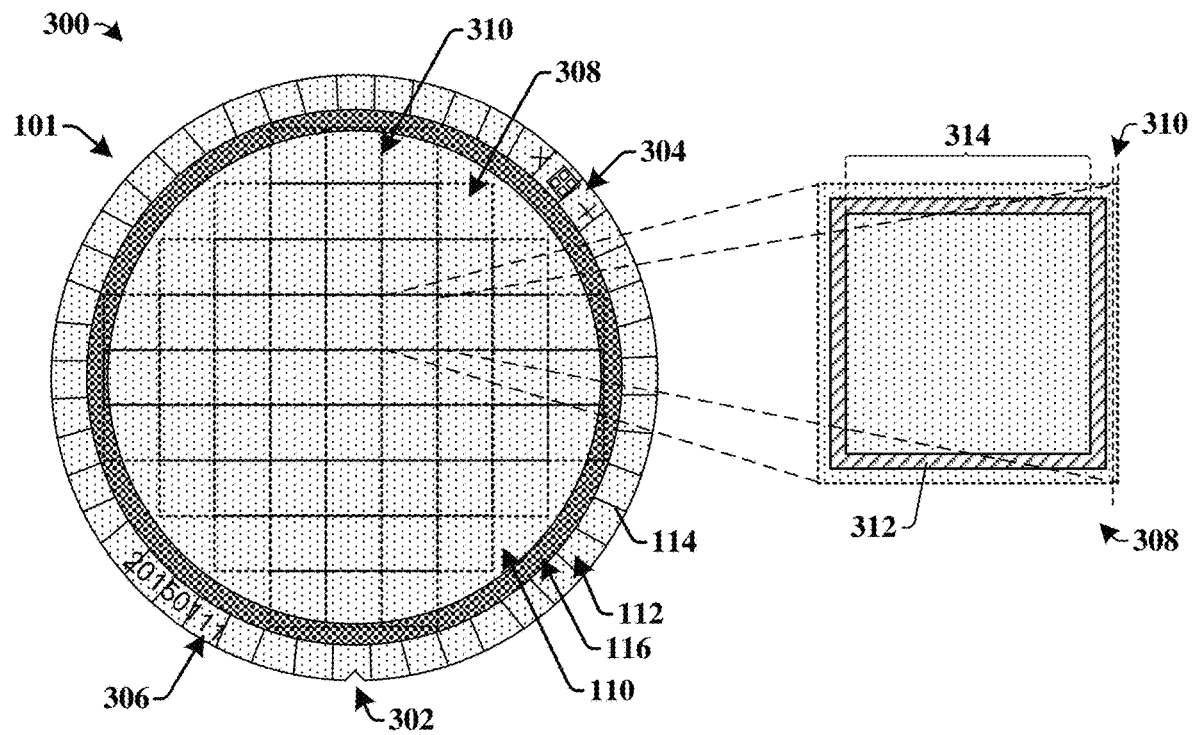
FIGS. 3A-3B illustrate top-views of some additional embodiments of a semiconductor structure comprising a crack stop ring trench.

FIG. 3A illustrates a top-view of some additional embodiments of a semiconductor structure 300 comprising a crack stop ring trench.

The semiconductor structure 300 comprises a stacked semiconductor substrate 101 comprising one or more semiconductor material disposed over a base semiconductor substrate. In some embodiments, the stacked semiconductor substrate 101 may comprise a notch 302 arranged along an outermost perimeter of the stacked semiconductor substrate 101.

The stacked semiconductor substrate 101 further comprises a crack stop ring trench 116 disposed between a central region 110 of the stacked semiconductor substrate 101 and a peripheral region 112 of the stacked semiconductor substrate 101. In some embodiments, one or more alignment marks 304 may be arranged within the peripheral region 112 of the stacked semiconductor substrate 101. The one or more alignment marks 304 are configured to align with alignment marks on a photolithography reticle to provide for alignment during a lithographic process (e.g., when printing an overlying processing level, alignment marks on a reticle are aligned with the one or more alignment marks 304 to properly align the reticle). In some embodiments, the one or more alignment marks 304 may comprise depressions arranged within the stacked semiconductor substrate 101.

In some embodiments, a plurality of wafer identification marks 306 may also be disposed within the peripheral region 112 of the stacked semiconductor substrate 101. The plurality of wafer identification marks 306 may comprise a plurality of alpha-numeric characters arranged next to one another as a string of characters. In some embodiments, the plurality of wafer identification marks 306 may comprise depressions arranged within the stacked semiconductor substrate 101.

A plurality of die regions 308 are disposed within the central region 110. The plurality of die regions 308 are separated from one another by scribe lines 310 that are configured to be removed during singulation of the stacked semiconductor substrate 101 into a plurality of separate die. In some embodiments, the scribe lines 310 extend along outer perimeters of the plurality of die regions 308. In some embodiments, the plurality of die regions 308 may further comprise a seal-ring structure 312 extending in closed loop around a device region 314 comprising one or more semiconductor devices. In various embodiments, the one or more semiconductor devices may comprise a transistor device (e.g., a high electron mobility transistor (HEMT) device), an optoelectronic or photonic device (e.g., a photodiode, a light emitting diode, etc.), or the like. In some embodiments, the crack stop ring trench 116 may extend to within one or more of the plurality of die regions 308 (e.g., to within one or more of the peripheral die regions). In some embodiments (not shown), the semiconductor substrate 101 may comprise one or more cracks 114 extending into or near a peripheral die region of the plurality of die regions 308. In some embodiments, the crack stop ring trench 116 may extend across the peripheral die region, so as to separate the one or more cracks 114 from inner die regions of the plurality of die regions and therefore protect the inner die regions from an extension of the one or more crack 114. In such embodiments, the peripheral die region may comprise the one or more cracks and the crack stop ring trench 116. In some embodiments, the peripheral die region may be a dummy die or testing die.

Figure 3B:
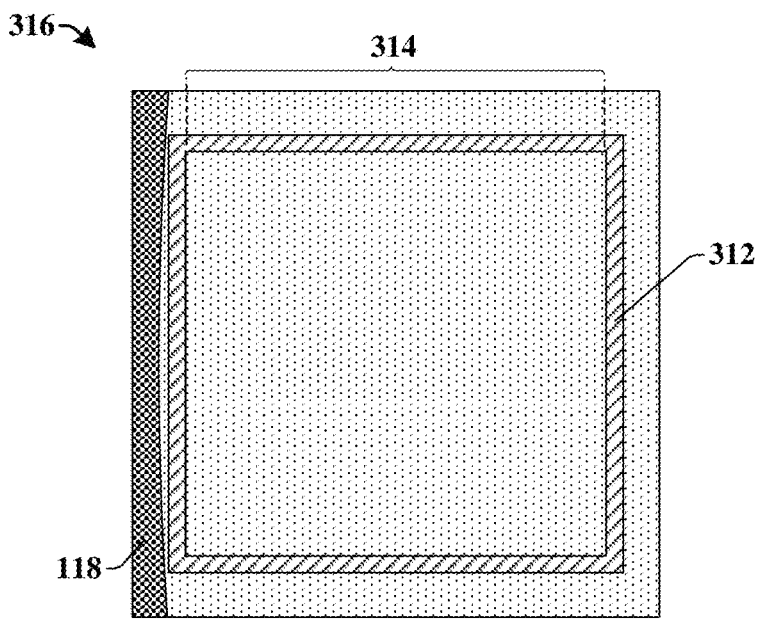

FIG. 3B illustrates a top view of some embodiments of a die 316 comprising a part of a crack stop ring trench.

The die 316 comprises a device region 314 having one or more semiconductor devices. In some embodiments, the seal-ring structure 312 surrounds the device region 314. The seal-ring structure 312 is configured to mitigate die-sawing stress and/or the introduction of contaminants into the device region 314 of the stacked semiconductor substrate during singulation. A part of the crack stop ring trench 116 extends to within the die 316. In some such embodiments, a part of the crack stop ring trench 116 may extend along one or more sides of the die 316. In some embodiments, the seal-ring structure 312 may be arranged between the part of the crack stop ring trench 116 and the device region 314.

Figure 4:
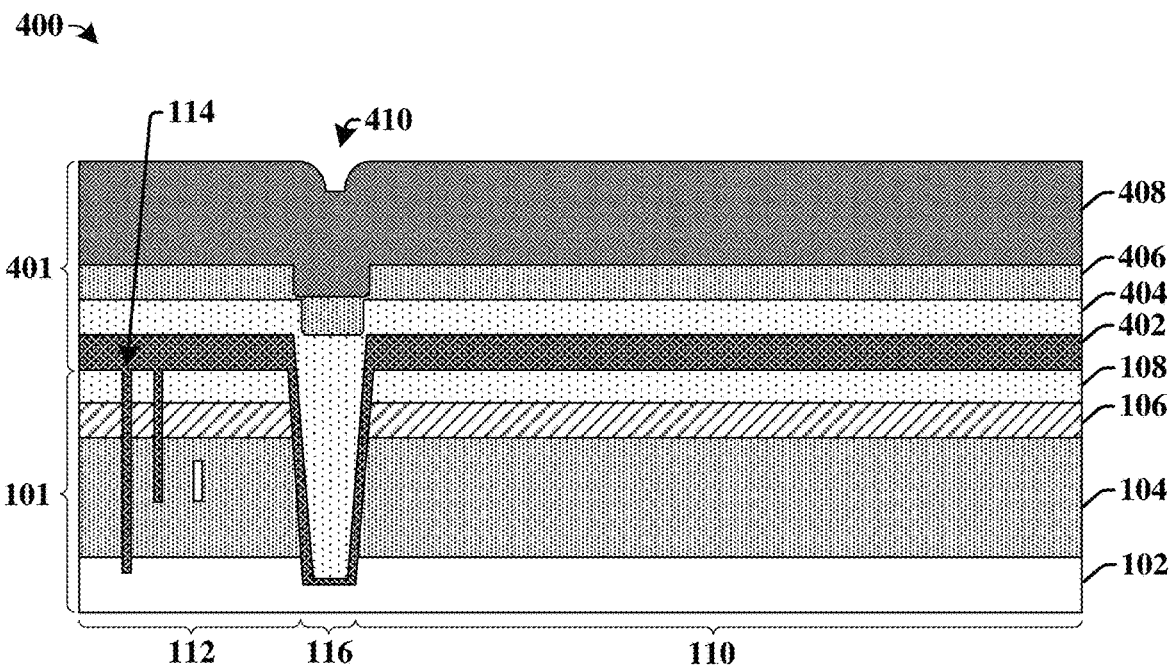
FIG. 4 illustrates a cross-sectional view of some additional embodiments of a semiconductor structure comprising a crack stop ring trench

FIG. 4 illustrates a cross-sectional view of some additional embodiments of a semiconductor structure 400 comprising a crack stop ring trench separating a central region from a surrounding peripheral region.

The semiconductor structure 400 comprises a stacked semiconductor substrate 101 having a plurality of semiconductor materials stacked onto a base semiconductor substrate 102. In some embodiments, plurality of semiconductor materials may comprise a buffer layer 104 disposed over the base semiconductor substrate 102, an active layer 202 over the buffer layer 104, a barrier layer 106 over the active layer 202, and a doped semiconductor layer 108 over the barrier layer 106. A crack stop ring trench 116 extends through the barrier layer 106, the active layer 202, the buffer layer 104, and into the base semiconductor substrate 102.

A plurality of dielectric materials 401 are disposed over the stacked semiconductor substrate 101, within the crack stop ring trench 116, and/or within one or more of a plurality of cracks 114. In some embodiments, a first plurality of dielectric materials may be disposed within the crack stop ring trench 116 and a second plurality of dielectric materials may be disposed within the plurality of cracks 114. In some embodiments, the first plurality of dielectric materials may comprise more dielectric materials than the second plurality of dielectric materials (e.g., so that there are more dielectric materials in the crack stop ring trench 116 than in the plurality of cracks 114).

In some embodiments, the plurality of dielectric materials 401 comprise a first dielectric material 402 disposed over the doped semiconductor layer 108, within the crack stop ring trench 116, and/or within one or more of a plurality of cracks 114. The first dielectric material 402 may have exterior sidewalls that extend along the sidewalls 116s of the stacked semiconductor substrate 101 and interior sidewalls that define a first recess within an upper surface of the first dielectric material 402. In some embodiments, the first dielectric material 402 may be configured to passivate surface traps within the stacked semiconductor substrate 101 (e.g., along sidewalls of the base semiconductor substrate 102, the buffer layer 104, the active layer 202, the barrier layer 106 and/or the doped semiconductor layer 108). In some embodiments, the first dielectric material 402 may comprise an oxide (e.g., silicon oxide).

In some additional embodiments, the plurality of dielectric materials 401 may further comprise a second dielectric material 404 disposed on the first dielectric material 402 and within the crack stop ring trench 116. In some embodiments, the second dielectric material 404 may fill the first recess within an upper surface of the first dielectric material 402. In some embodiments, the second dielectric material 404 may comprise a second recess within an upper surface of the second dielectric material 404. The second recess may be disposed directly over the first recess. In some embodiments, the first dielectric material 402 may comprise an oxide (e.g., silicon dioxide).

In some additional embodiments, the plurality of dielectric materials 401 may further comprise a third dielectric material 406 disposed over the second dielectric material 404 and a fourth dielectric material 408 disposed over the third dielectric material 406. In some embodiments, the third dielectric material 406 may have sidewalls defining a third recess that is within an upper surface of the third dielectric material 406 and directly over the second recess. In some embodiments, the fourth dielectric material 408 may have sidewalls defining a fourth recess 410 that is within an upper surface of the fourth dielectric material 408 and directly over the third recess. In some embodiments, the third dielectric material 406 and the fourth dielectric material 408 may respectively comprise an inter-level dielectric (ILD) layer configured to surround one or more conductive interconnects (not shown). In some embodiments, the third dielectric material 406 and the fourth dielectric material 408 may respectively comprise an oxide (e.g., silicon dioxide).

Figure 5:
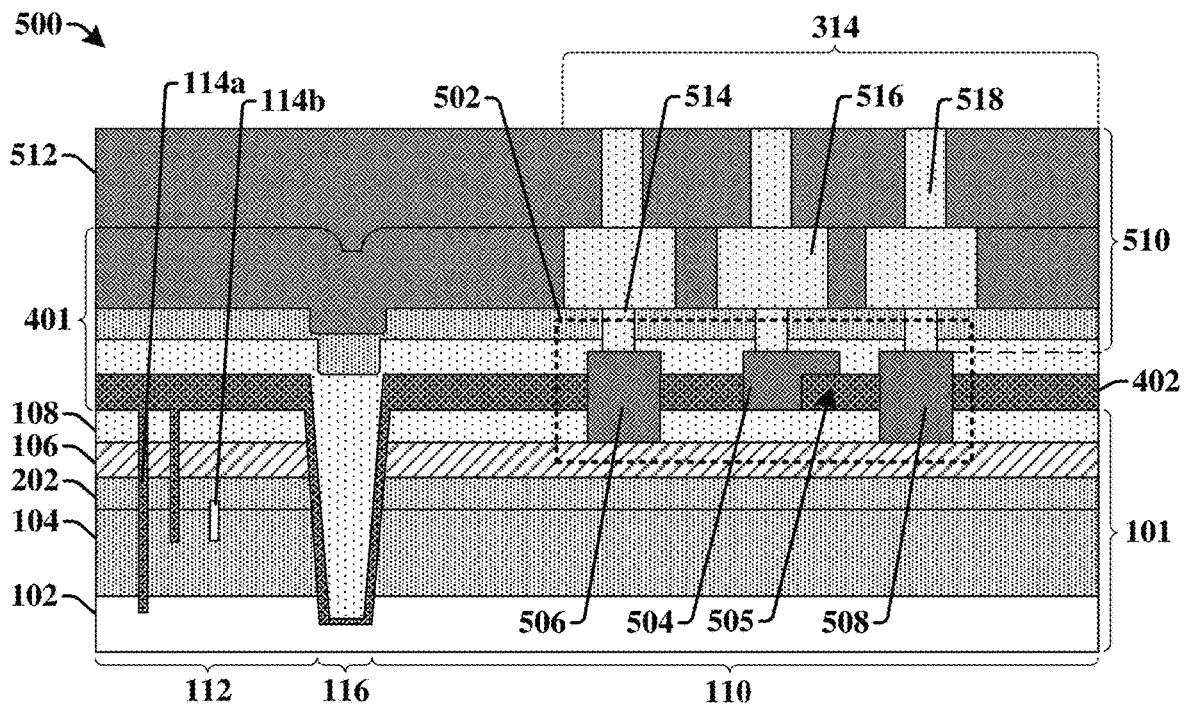
FIG. 5 illustrates a cross-sectional view of some additional embodiments of a semiconductor structure comprising a crack stop ring trench and device region comprising a transistor device.

FIG. 5 illustrates a cross-sectional view of some additional embodiments of a semiconductor structure 500 comprising a crack stop ring trench and device region comprising a transistor device.

The semiconductor structure 500 comprises a stacked semiconductor substrate 101 comprising a buffer layer 104 over the base semiconductor substrate 102, an active layer 202 over the buffer layer 104, a barrier layer 106 over the active layer 202, and a doped semiconductor layer 108 over the barrier layer 106. A crack stop ring trench 116 extends into the stacked semiconductor substrate 101 between a central region 110 and a peripheral region 112. The central region 110 comprises a device region 314 having one or more semiconductor devices. A plurality of dielectric materials 401 are disposed over the stacked semiconductor substrate 101 and/or within the crack stop ring trench 116.

In some embodiments, the one or more semiconductor devices may comprise a high electron mobility transistor (HEMT) device 502 disposed over the stacked semiconductor substrate 101. The HEMT device 502 comprises a gate structure 504 disposed laterally between a source contact 506 and a drain contact 508. In some embodiments, the source contact 506 and/or the drain contact 508 may vertically extend through one or more of the plurality of dielectric materials 401 and through the doped semiconductor layer 108 to a bottom surface that contacts the barrier layer 106. In some embodiments, the gate structure 504 may vertically extend through one or more of the plurality of dielectric materials 401 to a bottom surface that contacts the doped semiconductor layer 108. In some embodiments, the gate structure may comprise a field plate region 505 extending outward from a sidewall of the gate structure 504 to over a first dielectric material 402 of the plurality of dielectric materials 401.

A two-dimensional electron gas (2DEG) is inherently present at the heterojunction between the active layer 202 and the barrier layer 106. Because a 2DEG is inherently present between the active layer 202 and the barrier layer 106, electrons are able to move freely along the interface. The gate structure 504 is configured to control the flow of electrons (e.g., to interrupt the underlying 2DEG so as to prevent electrons from moving freely under the gate structure) between the source contact 506 and the drain contact 508 during operation of the HEMT device 502. In some embodiments, the doped semiconductor layer 108 allows for the gate structure 504 to prevent unwanted currents from flowing between the source contact and the drain contact (i.e., to form the HEMT device 502 in a "normally off" mode).

In some embodiments, the gate structure 504 may comprise a first conductive material, such as a metal (e.g., aluminum, titanium, copper, tungsten, tantalum, or the like) or doped polysilicon. In some embodiments, the source contact 506 and/or the drain contact 508 may comprise a second conductive material, such as a metal (e.g., aluminum, titanium, copper, tungsten, tantalum, or the like).

The gate structure 504, the source contact 506, and the drain contact 508 are electrically connected to one or more conductive layers 510. In some embodiments, the one or more conductive layers 510 may be disposed within an upper inter-level dielectric (ILD) layer 512 disposed over the plurality of dielectric materials 401. In some additional embodiment, the one or more conductive layers 510 may be disposed within one or more of the plurality of dielectric materials 401. In some embodiments, the one or more conductive layers 510 may comprise interconnects including conductive contacts 514, interconnect wires 516, and/or interconnect vias 518. In some additional embodiments (not shown), the one or more conductive layers 510 may further comprise redistribution layers, conductive layers within an interposer substrate, conductive traces on a printed circuit board, or the like. In various embodiments, the one or more conductive layers 510 may comprise copper, tungsten, ruthenium, aluminum, carbon nano-tubes, or the like. In some embodiments, the upper ILD layer 512 may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

Figure 6:
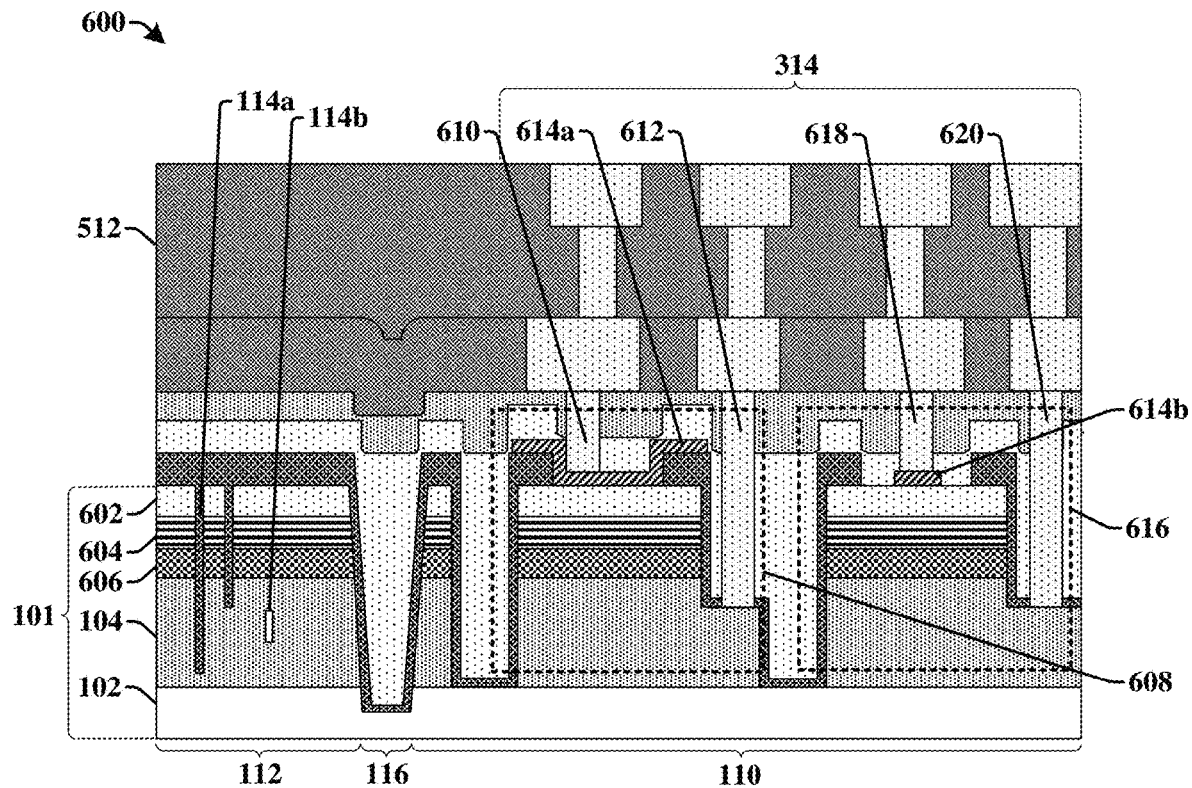
FIG. 6 illustrates a cross-sectional view of some additional embodiments of a semiconductor structure comprising a crack stop ring trench and a device region comprising optoelectronic devices.

FIG. 6 illustrates a cross-sectional view of some additional embodiments of a semiconductor structure 600 comprising a crack stop ring trench and a device region comprising photonic devices.

The semiconductor structure 600 comprises a stacked semiconductor substrate 101 comprising a buffer layer 104 over a base semiconductor substrate 102, a first doped semiconductor layer 602 over the buffer layer 104, a multiple quantum well (MQW) structure 604 (e.g., indium gallium nitride InGaN) over the first doped semiconductor layer 602, and a second doped semiconductor layer 606 over the MQW structure 604. The first doped semiconductor layer 602 may have a first doping type (e.g., an n-type doping) that is different than a second doping type (e.g., a p-type doping) of the second doped semiconductor layer 606. In some embodiments, the first doped semiconductor layer 602 and the second doped semiconductor layer 606 may comprise a same semiconductor material (e.g., GaN).

A crack stop ring trench 116 extends into the stacked semiconductor substrate 101 between a central region 110 and a peripheral region 112. The central region 110 comprises a device region 314 having one or more semiconductor devices. A plurality of dielectric materials 401 are disposed over the stacked semiconductor substrate 101 and/or within the crack stop ring trench 116.

In some embodiments, the one or more semiconductor devices may comprise optoelectronic or photonic devices. For example, in some embodiments the one or more semiconductor devices may comprise a photodiode 608. In such embodiments, the photodiode 608 may comprise a stack including the first doped semiconductor layer 602, the MQW structure 604, and the second doped semiconductor layer 606. A first conductive contact 610 is arranged on the second doped semiconductor layer 606 and a second conductive contact 612 is arranged on the first doped semiconductor layer 602. In some embodiments, an Ohmic contact layer 614a (e.g., indium tin oxide (ITO)) may be disposed between the second doped semiconductor layer 606 and the first conductive contact 610. In other embodiments, the first conductive contact 610 may directly contact the second doped semiconductor layer 606.

In other embodiments, the one or more semiconductor devices may comprise a light emitting diode (LED) 616. In such embodiments, the LED 616 may comprise a stack including the first doped semiconductor layer 602, the MQW structure 604, and the second doped semiconductor layer 606. A third conductive contact 618 is arranged on the second doped semiconductor layer 606 and a fourth conductive contact 620 is arranged on the first doped semiconductor layer 602. In some embodiments, an Ohmic contact layer 614b (e.g., indium tin oxide (ITO)) may be disposed between the second doped semiconductor layer 606 and the third conductive contact 618. In other embodiments, the third conductive contact 618 may directly contact the second doped semiconductor layer 606.

Figure 7:
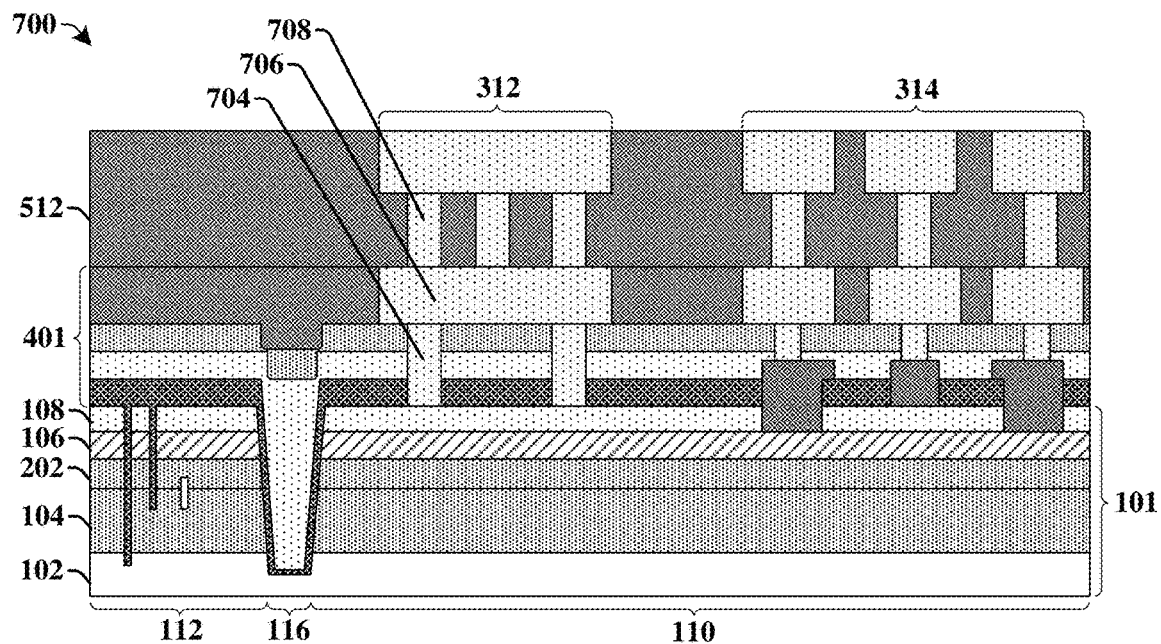
FIG. 7 illustrates a cross-sectional view of some additional embodiments of a semiconductor structure comprising a crack stop ring trench and a seal-ring structure.

FIG. 7 illustrates a cross-sectional view of some additional embodiments of a semiconductor structure 700 comprising a crack stop ring trench surrounding a central region comprising one or more semiconductor devices.

The semiconductor structure 700 comprises a stacked semiconductor substrate 101 comprising a buffer layer 104 over the base semiconductor substrate 102, an active layer 202 over the buffer layer 104, a barrier layer 106 over the active layer 202, and a doped semiconductor layer 108 over the barrier layer 106. A crack stop ring trench 116 extends into the stacked semiconductor substrate 101 between a central region 110 and a peripheral region 112 of the stacked semiconductor substrate 101. The central region 110 comprises a device region 314 having one or more semiconductor devices and a seal-ring structure 312 disposed between the device region 314 and the crack stop ring trench 116. A plurality of dielectric materials 401 are disposed over the stacked semiconductor substrate 101 and/or within the crack stop ring trench 116.

The seal-ring structure 312 is configured to mitigate die-sawing stress and/or the introduction of contaminants into the device region 314 of the stacked semiconductor substrate during singulation. In some embodiments, the seal-ring structure 312 may comprise a plurality of stacked conductive layers (e.g., interconnect layers) disposed within the plurality of dielectric materials 401 and an upper ILD layer 512 overlying the plurality of dielectric material 401. In some embodiments, the seal-ring structure 312 may comprise conductive contacts 704, interconnect wires 706, and/or interconnect vias 708 that are stacked onto one another and that are arranged in a continuous and unbroken conductive structure surrounding the device region 314 (e.g., as shown in the top-view of FIG. 3B).

FIGS. 8-26 illustrate cross-sectional views 800-2600 of some embodiments of a method of forming a semiconductor structure comprising a crack stop ring trench configured to mitigate the propagation of cracks within a stacked semiconductor substrate. Although FIGS. 8-26 are described in relation to a method, it will be appreciated that the structures disclosed in FIGS. 8-26 are not limited to such a method, but instead may stand alone as structures independent of the method.

Figure 8:
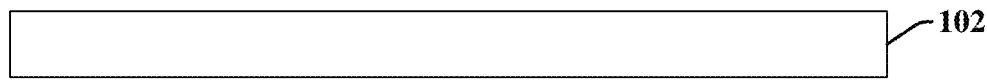
FIGS. 8-26 illustrate cross-sectional views of some embodiments of a method of forming a semiconductor structure comprising a crack stop ring trench configured to mitigate the propagation of cracks within a stacked semiconductor substrate.

As shown in cross-sectional view 800 of FIG. 8, a base semiconductor substrate 102 is provided. In various embodiments, the base semiconductor substrate 102 may be a silicon substrate, a silicon wafer, or the like. In some embodiments, the base semiconductor substrate 102 may comprise or be a first semiconductor material having a first coefficient of thermal expansion (CTE). In some additional embodiments, the first semiconductor material may comprise a first lattice constant.

Figure 9:
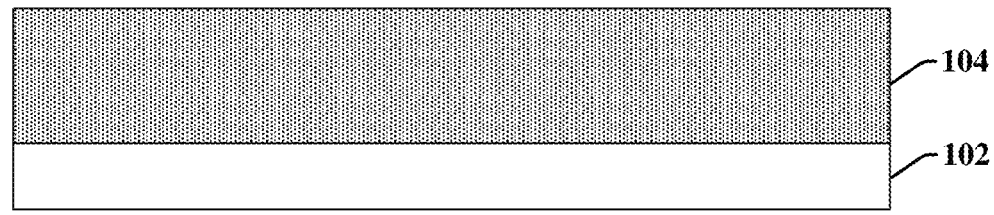

As shown in cross-sectional view 900 of FIG. 9, a buffer layer 104 is formed onto the base semiconductor substrate 102. The buffer layer 104 may be formed onto the base semiconductor substrate 102 at a first temperature that is greater than room temperature. In some embodiments, the first temperature may be greater than approximately 500° C., greater than approximately 800° C., greater than approximately 1000° C., or other similar values. In some embodiments, a nucleation layer may be formed onto the base semiconductor substrate 102 prior to forming the buffer layer 104.

The buffer layer 104 comprises or is a second semiconductor material. In various embodiments, the second semiconductor material may comprise or be a group III-nitride (III-N) semiconductor, such as a gallium nitride layer. The buffer layer 104 r may be formed to a thickness that is in a range of between approximately 5 nanometers and approximately 10 microns. In some embodiments, the second semiconductor material may comprise a second CTE that is different than (e.g., larger than) the first CTE. In some additional embodiments, the second semiconductor material may comprise a second lattice constant that is different than (e.g., larger than) the first lattice constant. In some embodiments, a lattice mismatch of greater than approximately 14% may be present between the first lattice constant and the second lattice constant, thereby leading to stress on the buffer layer 104. In some embodiments, the buffer layer 104 may be formed onto the base semiconductor substrate 102 by way of deposition processes (e.g., chemical vapor deposition (CVD), plasma enhanced chemical vapor deposition (PE-CVD), atomic layer deposition (ALD), physical vapor deposition (PVD), molecular organic chemical vapor deposition (MOCVD), etc.), a molecular beam epitaxy (MBE) process, or the like.

Figure 10:
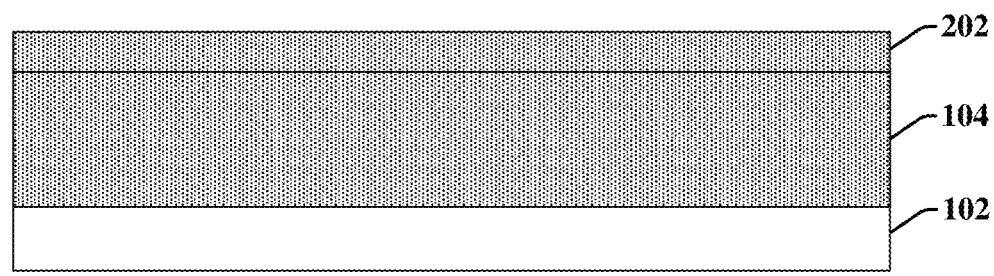

As shown in cross-sectional view 1000 of FIG. 10, in some embodiments an active layer 202 may be formed onto the buffer layer 104. In various embodiments, the active layer 202 may comprise a III-N semiconductor material, such as a gallium nitride layer. In some embodiments, the active layer 202 may be formed onto the buffer layer 104 by way of deposition processes (e.g., CVD, PE-CVD, ALD, PVD, MOCVD process, etc.), an MBE process, or the like. In some embodiments, the active layer 202 may be formed at or above room temperature (e.g., greater than approximately 500° C., greater than approximately 800° C., greater than approximately 1000° C., or other similar values).

Figure 11:
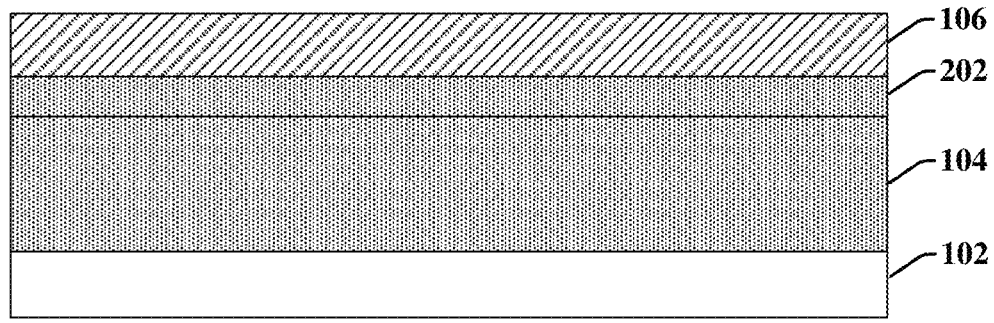

As shown in cross-sectional view 1100 of FIG. 11, a barrier layer 106 is formed over the active layer 202. The barrier layer 106 may comprise aluminum gallium nitride. In various embodiments, the barrier layer 106 may be formed by a MOCVD process, an MBE process, or the like. In some embodiments, the barrier layer 106 may be formed at or above room temperature (e.g., greater than approximately 500° C., greater than approximately 800° C., greater than approximately 1000° C., or other similar values).

As shown in cross-sectional view 1200, a doped semiconductor layer 108 may be formed over the barrier layer 106 to form a stacked semiconductor substrate 101. The doped semiconductor layer 108 may comprise a p-doped gallium nitride (p-GaN) layer. In some embodiments, the doped semiconductor layer 108 may be formed by way of a MOCVD process, an MBE process, or the like. In some embodiments, the doped semiconductor layer 108 may be formed at or above room temperature (e.g., greater than approximately 500° C., greater than approximately 800° C., greater than approximately 1000° C., or other similar values).

As shown in cross-sectional view 1300, the stacked semiconductor substrate 101 is cooled to a second temperature that is less than the first temperature. In some embodiments, the second temperature may be less than or equal to approximately 20° C., less than or equal to approximately 30° C., less than or equal to approximately 50° C., or other similar values. Because the buffer layer 104 has a different (e.g., larger) coefficient of thermal expansion (CTE) than the base semiconductor substrate 102, the stacked semiconductor substrate 101 will bow or curve when cooled down to the second temperature. In some embodiments, bowing of the stacked semiconductor substrate 101 may cause an outermost edge of the stacked semiconductor substrate 101 to be at a height that is vertically offset by a non-zero distance 1302 from a center of the stacked semiconductor substrate 101.

Figure 13:
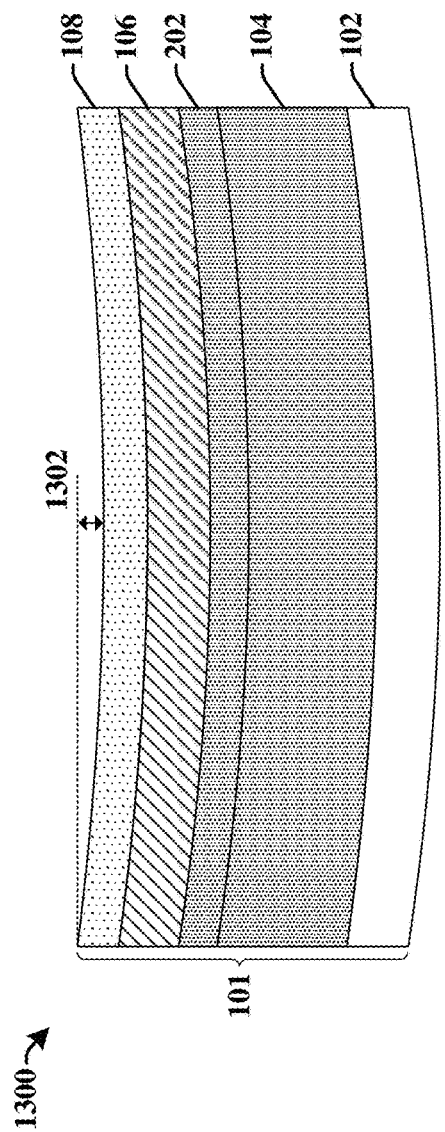
Figure 14:
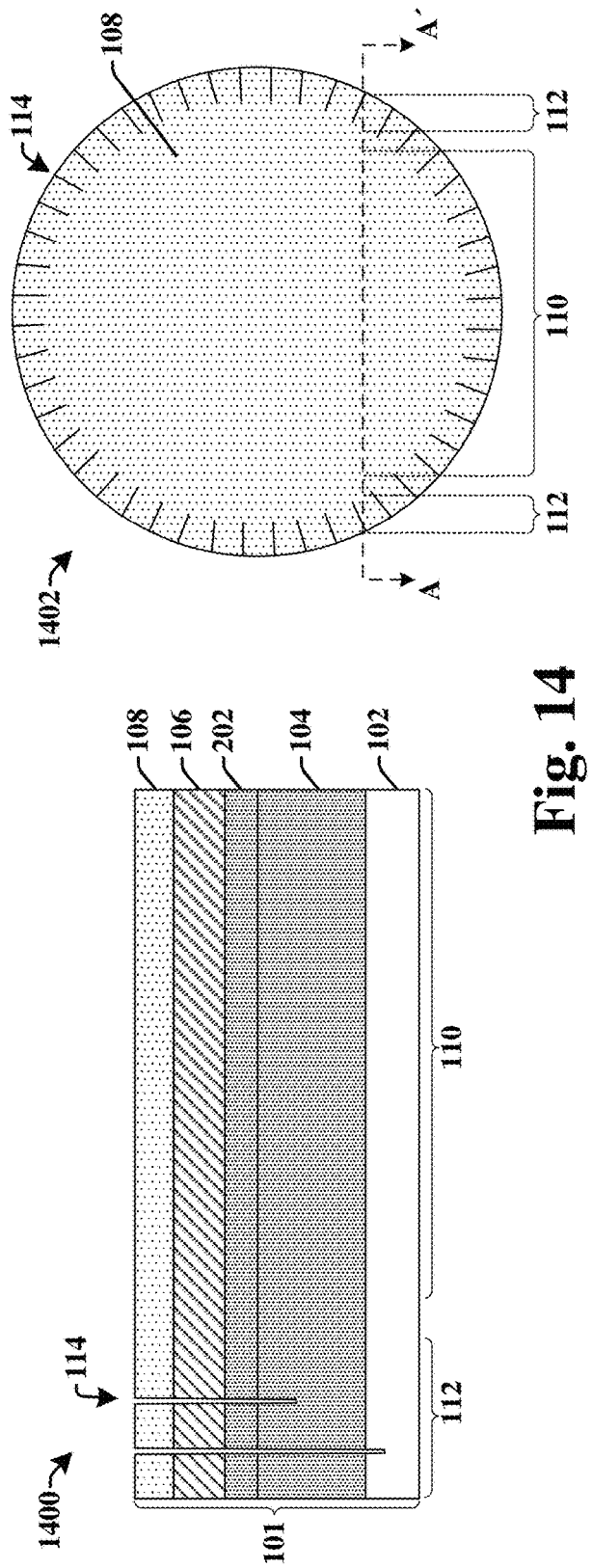

As shown in cross-sectional view 1400 of FIG. 14, after being cooled to the second temperature the stacked semiconductor substrate 101 will return to substantially flat structure. However, if the curvature of the stacked semiconductor substrate 101, shown in cross-sectional view 1300 of FIG. 13, exceeds the mechanical strength of the material, a plurality of cracks 114 will form in the stacked semiconductor substrate 101. The plurality of cracks 114 may be formed within a peripheral region 112 of the stacked semiconductor substrate 101. As shown in top-view 1402 of FIG. 14, the peripheral region 112 of the stacked semiconductor substrate 101 surrounds a central region 110 of the stacked semiconductor substrate 101. In some embodiments, the stress caused by the lattice mismatch between the base semiconductor substrate 102 and the buffer layer 104 may also contribute, in conjunction with the thermal stress caused by the different CTEs, to the formation of the plurality of cracks 114.

Figure 15:
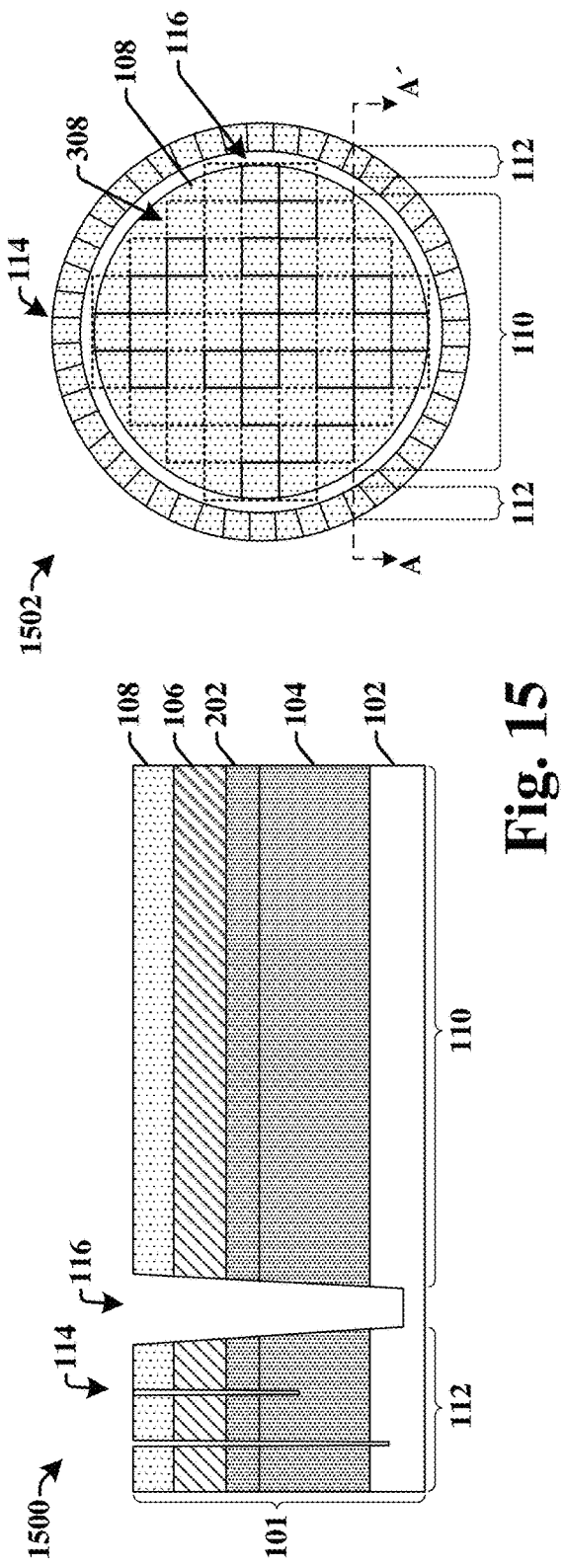

As shown in cross-sectional view 1500 and top-view 1502 of FIG. 15, a crack stop ring trench 116 is formed within the stacked semiconductor substrate 101. The crack stop ring trench 116 extends in a continuous and closed loop around the stacked semiconductor substrate 101. The crack stop ring trench 116 separates the peripheral region 112 of the stacked semiconductor substrate 101 from the central region 110 of the stacked semiconductor substrate 101. In some embodiments, the central region 110 of the stacked semiconductor substrate 101 may comprise a plurality of die regions 308, which are configured to subsequently contain one or more semiconductor devices.

In some embodiments, the crack stop ring trench 116 may vertically extend from an upper surface of the doped semiconductor layer 108 to within the base semiconductor substrate 102. In some embodiments, the crack stop ring trench 116 may be formed by an etching process. In such embodiments, the stacked semiconductor substrate 101 may be selectively exposed to one or more etchants according to a masking layer formed over the stacked semiconductor substrate 101. In some embodiments, the one or more etchants may comprise a dry etch (e.g., a reactive ion etchant, an inductively coupled reactive ion etchant). In various embodiments, the masking layer may comprise a dielectric material (e.g., silicon dioxide, silicon nitride, or the like), a photosensitive material (e.g., photoresist), or the like. In other embodiments, the crack stop ring trench 116 may be formed by a laser drilling process or other similar processes.

Figure 16:
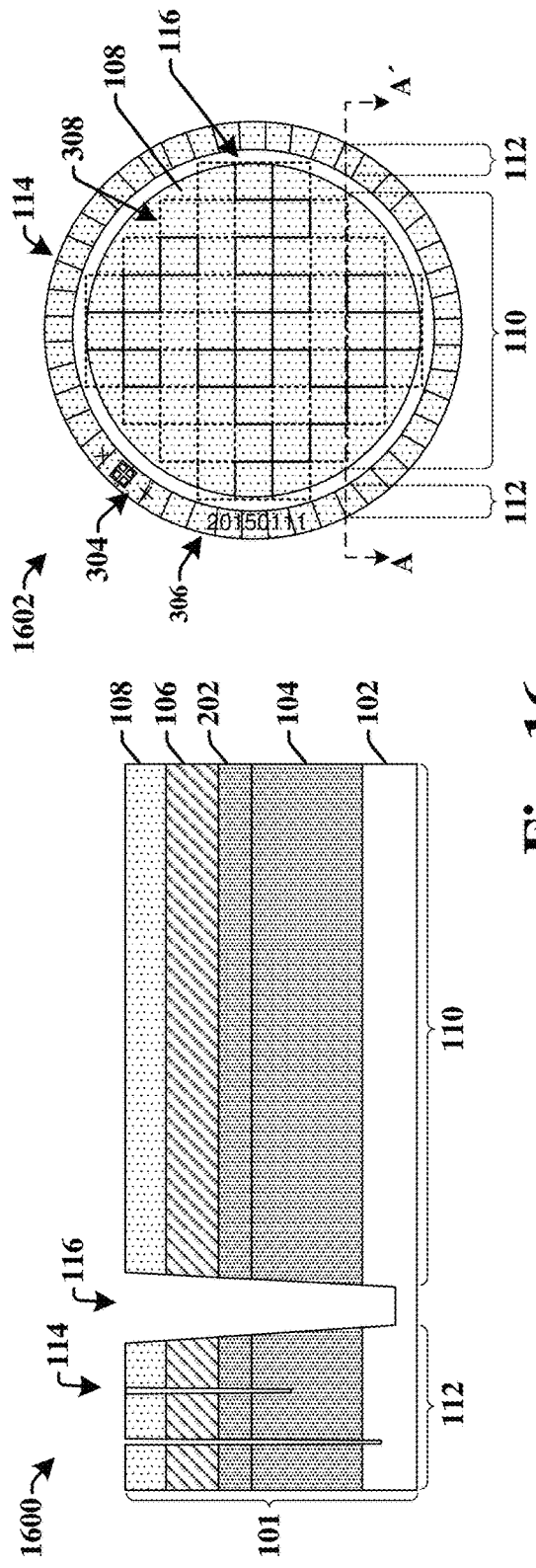

As shown in cross-sectional view 1600 and top-view 1602 of FIG. 16, one or more alignment marks 304 may be formed within the peripheral region 112 of the stacked semiconductor substrate 101. The one or more alignment marks 304 are configured to align with alignment marks on a photolithography reticle to provide for alignment during a lithographic process. In some embodiments, the one or more alignment marks 304 may be formed by an etching process that forms depressions within an upper surface of the stacked semiconductor substrate 101.

In some additional embodiments, a plurality of wafer identification marks 306 may also be formed within the peripheral region 112 of the stacked semiconductor substrate 101. The plurality of wafer identification marks 306 may comprise a plurality of alpha-numeric characters arranged next to one another as a string of characters. In some embodiments, the plurality of wafer identification marks 306 may be formed by an etching process that forms depressions arranged within the stacked semiconductor substrate 101.

Figure 17:
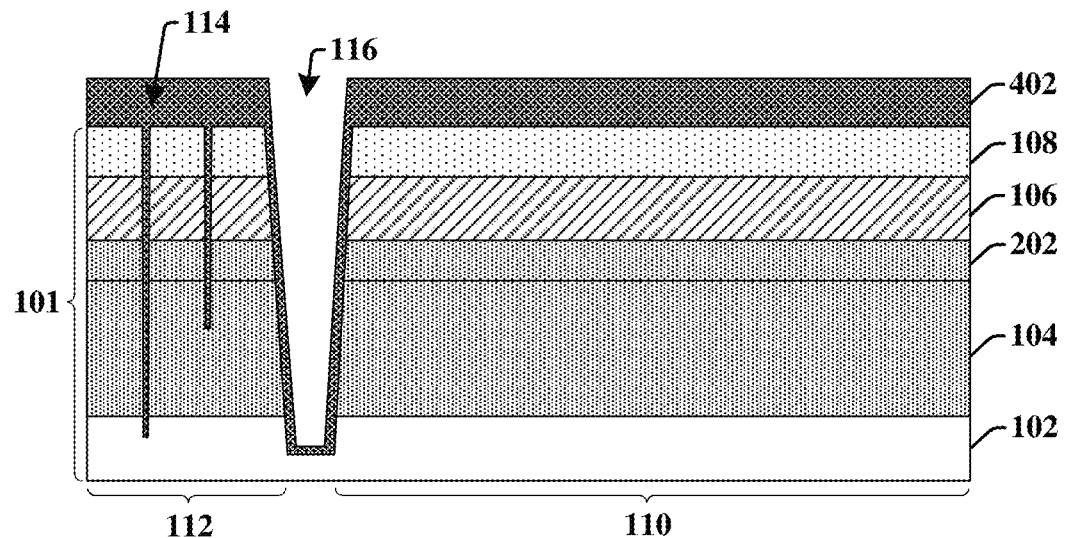

As shown in cross-sectional view 1700 of FIG. 17, a first dielectric material 402 is formed over the stacked semiconductor substrate 101 and along sidewalls of the stacked semiconductor substrate 101 defining the crack stop ring trench 116. In some embodiments, the first dielectric material 402 lines the sidewalls of the stacked semiconductor substrate 101 defining the crack stop ring trench 116 and has interior sidewalls that define a first recess within an upper surface of the first dielectric material 402. In some additional embodiments, the first dielectric material 402 may fill one or more of the plurality of cracks 114. In some embodiments, the first dielectric material 402 may comprise an oxide (e.g., silicon dioxide). In some embodiments, the first dielectric material 402 may be formed by way of a deposition process (e.g., CVD, PE-CVD, ALD, PVD, etc.). In some embodiments, the first dielectric material 402 may be configured to passivate surface defects (e.g., surface traps) generated during formation of the crack stop ring trench 116. Passivating the surface defects may decrease current leakage within devices subsequently formed in the stacked semiconductor substrate 101.

Figure 18:
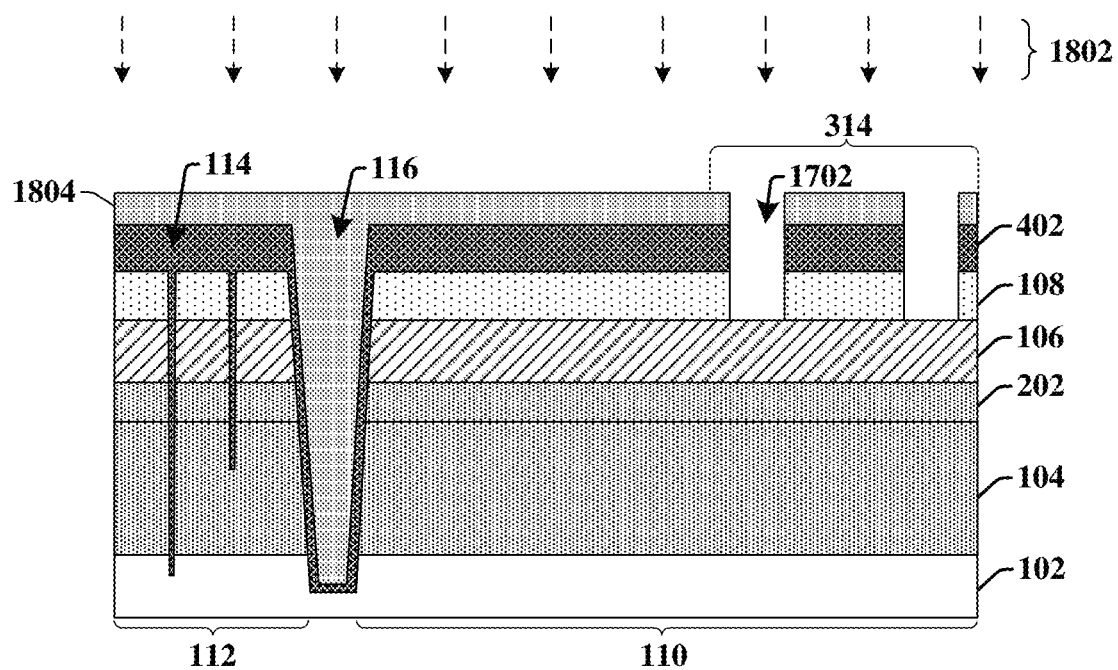

As shown in cross-sectional view 1800 of FIG. 18, a first patterning process is performed to pattern the first dielectric material 402. The first patterning process removes parts of the first dielectric material 402 to form source/drain openings 1702 that expose an upper surface of the barrier layer 106 within a device region 314 within the central region 110 of the stacked semiconductor substrate 101.

In some embodiments, the first patterning process may selectively expose the first dielectric material 402 to a first etchant 1802 according to a first masking structure 1804 formed over the barrier layer 106. In some embodiments, the first masking structure 1804 may comprise a photosensitive material (e.g., a photoresist). In other embodiments, the first masking structure 1804 may comprise a dielectric masking layer (e.g., silicon oxide, silicon dioxide, or the like), a hard mask, and/or the like. In some embodiments, the first etchant 1802 may comprise a dry etchant (e.g., having a fluorine chemistry, a chlorine chemistry, or the like). In other embodiments, the first etchant 1802 may comprise a wet etchant (e.g., comprising hydrofluoric acid, potassium hydroxide, or the like).

Figure 19:
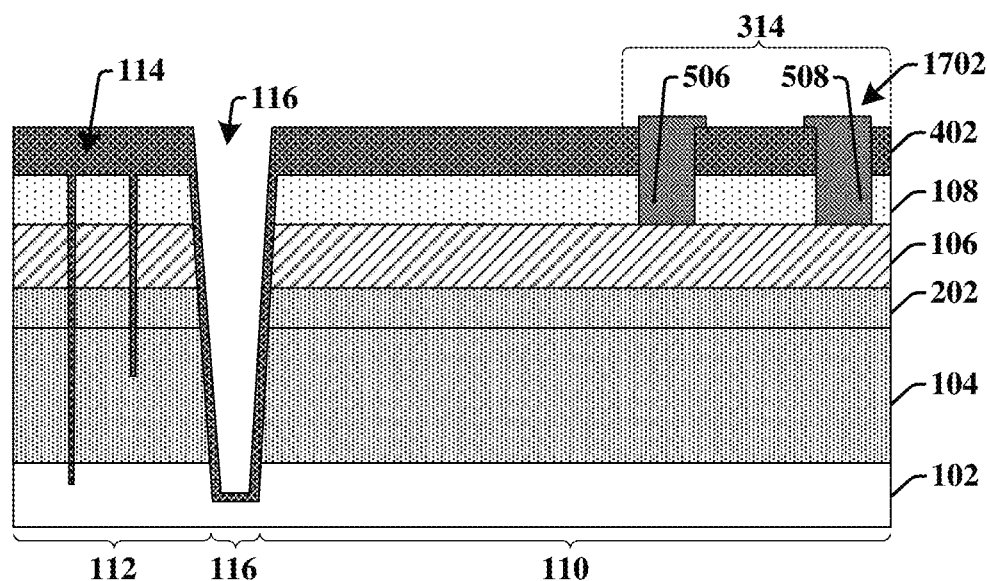

As shown in cross-sectional view 1900 of FIG. 19, a source contact 506 and a drain contact 508 are formed within the source/drain openings 1702. In some embodiments, the source contact 506 and the drain contact 508 may be formed by forming a conductive material (e.g., aluminum, copper, or the like) within the source/drain openings 1702 and over the first dielectric material 402. The conductive material is subsequently etched to define the source contact 506 and the drain contact 508. In some embodiments, the conductive material may be formed by a deposition process and/or a plating process.

Figure 20:
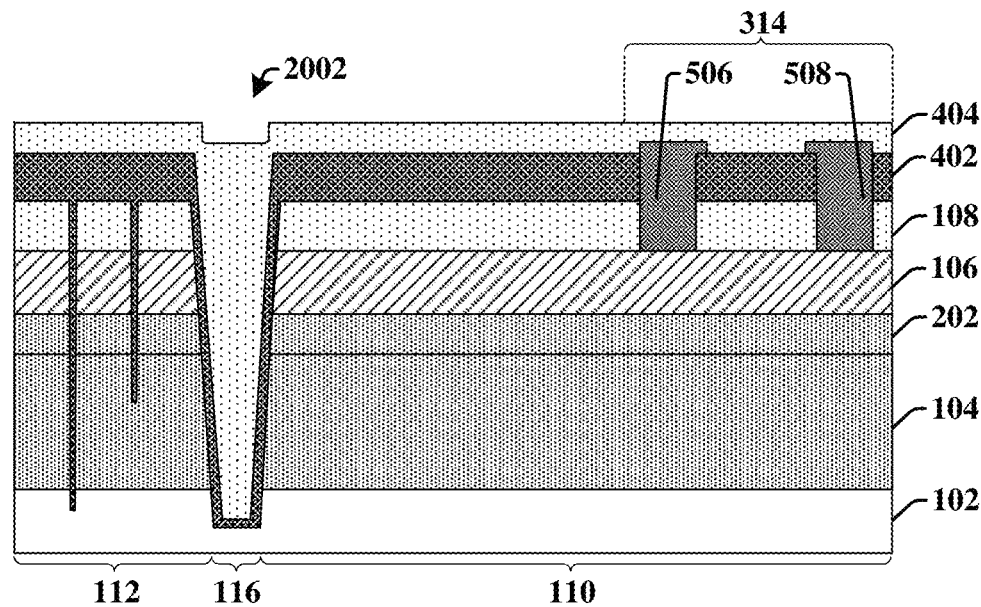
Figure 21:
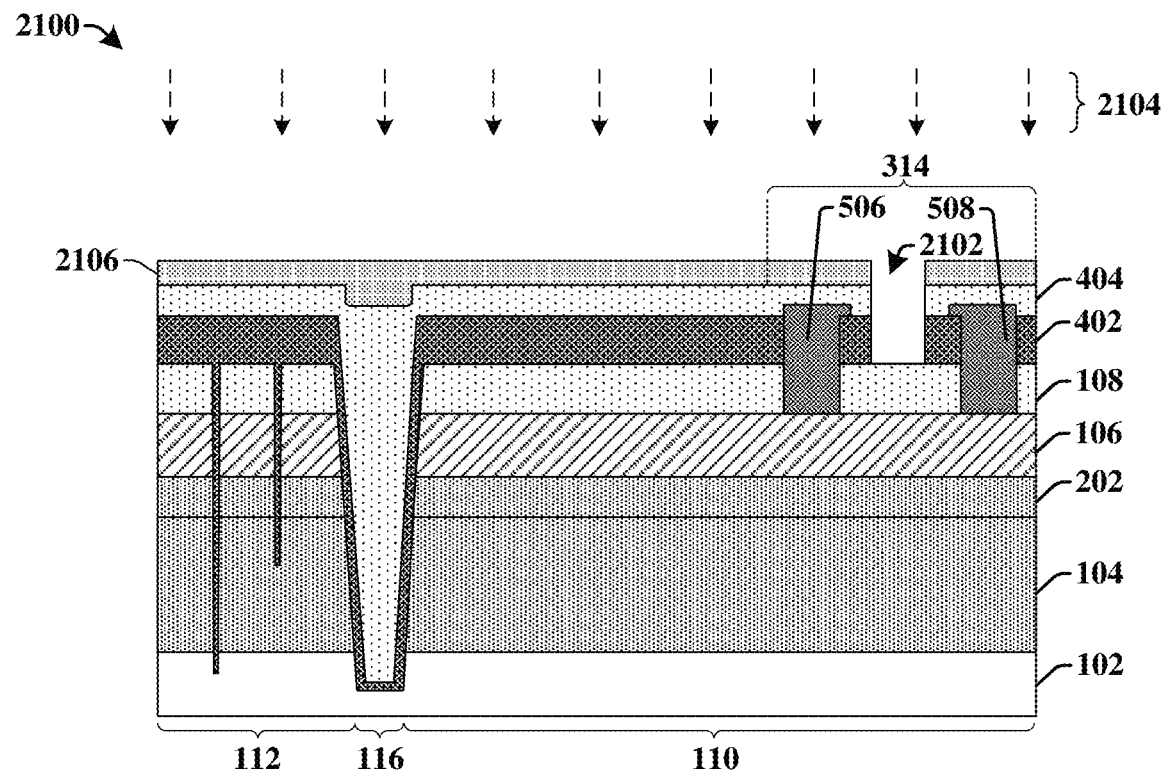

As shown in cross-sectional view 2000 of FIG. 20, a second dielectric material 404 is formed over an upper surface of the first dielectric material 402 and along the interior sidewalls of the first dielectric material 402. In some embodiments, the second dielectric material 404 has an upper surface that is directly over the crack stop ring trench 116 and that is vertically above the upper surface of the stacked semiconductor substrate 101. In some additional embodiments, the second dielectric material 404 may have one or more sidewalls defining a second recess 2002 that is directly over the crack stop ring trench 116. In some embodiments, the second dielectric material 404 may comprise a nitride (e.g., silicon nitride). In some embodiments, the second dielectric material 404 may be formed by way of a deposition process (e.g., CVD, PE-CVD, ALD, PVD, etc.), As shown in cross-sectional view 2100 of FIG. 21, a second patterning process is performed to pattern the first dielectric material 402 and the second dielectric material 404 to form a gate opening 2102 that exposes an upper surface of the doped semiconductor layer 108 within the device region 314. In some embodiments, the second patterning process may selectively expose the first dielectric material 402 and the second dielectric material 404 to a second etchant 2104 according to a second masking structure 2106 formed over the second dielectric material 404. In various embodiments, the second masking structure 2106 may comprise a photosensitive material (e.g., a photoresist), a dielectric masking layer (e.g., silicon oxide, silicon dioxide, or the like), a hard mask, and/or the like. In various embodiments, the second etchant 2104 may comprise a dry etchant or a wet etchant.

Figure 22:
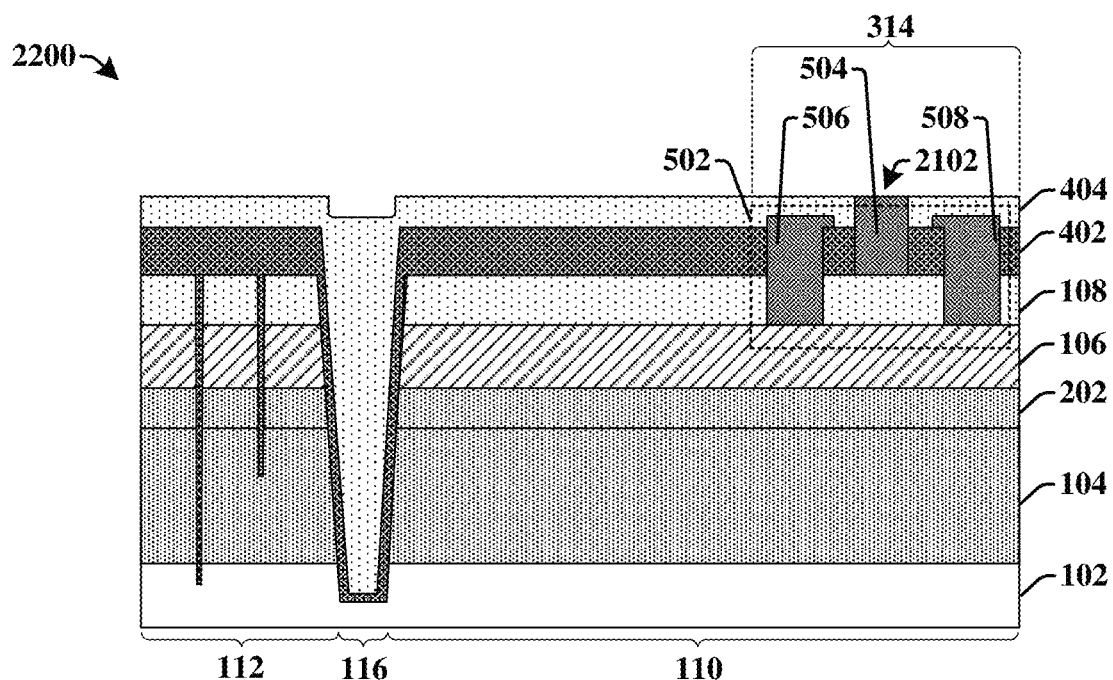

As shown in cross-sectional view 2200 of FIG. 22, a gate structure 504 is formed within the gate opening 2102. In some embodiments, the gate structure 504 may be formed by forming a conductive material (e.g., aluminum, copper, doped polysilicon, or the like) within the gate opening 2102 and over the second dielectric material 404. The conductive material is subsequently etched to define the gate structure 504. In some embodiments, the conductive material may be formed by a deposition process and/or a plating process.

Figure 23:
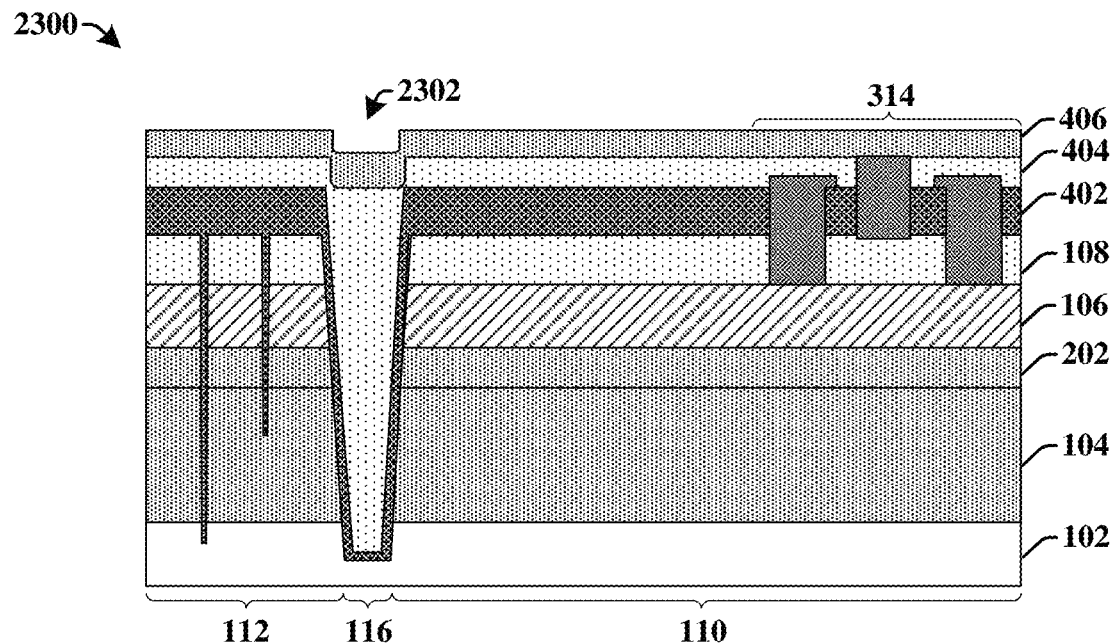

As shown in cross-sectional view 2300 of FIG. 23, a third dielectric material 406 is formed over an upper surface of the second dielectric material 404. In some embodiments, the third dielectric material 406 may have one or more sidewalls defining a third recess 2302 that is directly over the crack stop ring trench 116. In some embodiments, the third dielectric material 406 may comprise an oxide (e.g., silicon dioxide).

Figure 24:
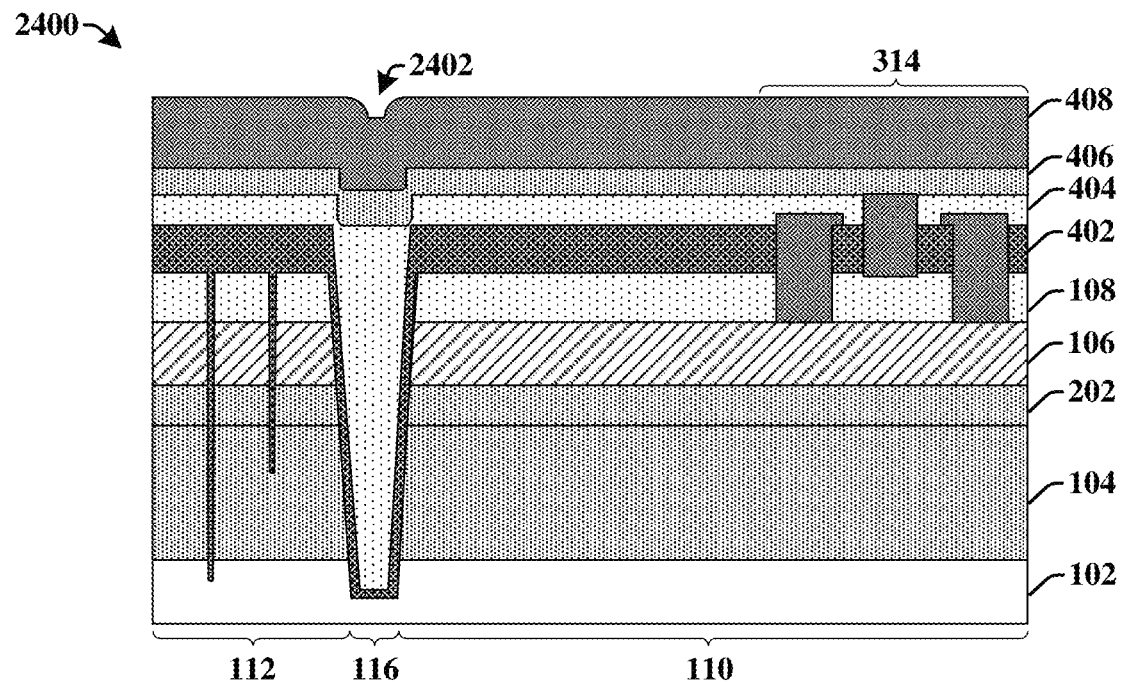

As shown in cross-sectional view 2400 of FIG. 24, a fourth dielectric material 408 is formed over an upper surface of the third dielectric material 406. In some embodiments, the fourth dielectric material 408 may have one or more sidewalls defining a fourth recess 2402 that is directly over the crack stop ring trench 116. In some embodiments, the fourth dielectric material 408 may comprise an oxide (e.g., silicon dioxide).

Figure 25:
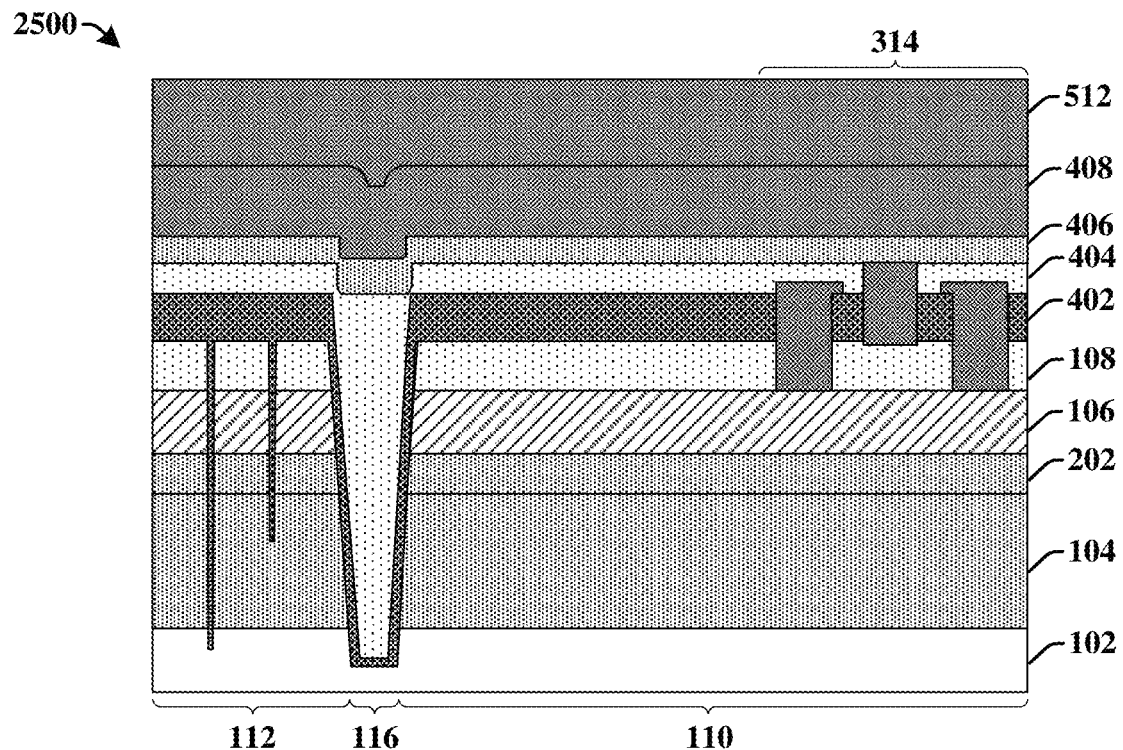

As shown in cross-sectional view 2500 of FIG. 25, an upper inter-level dielectric (ILD) layer 512 is formed over an upper surface of the fourth dielectric material 408. In some embodiments, the upper ILD layer 512 may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

Figure 26:
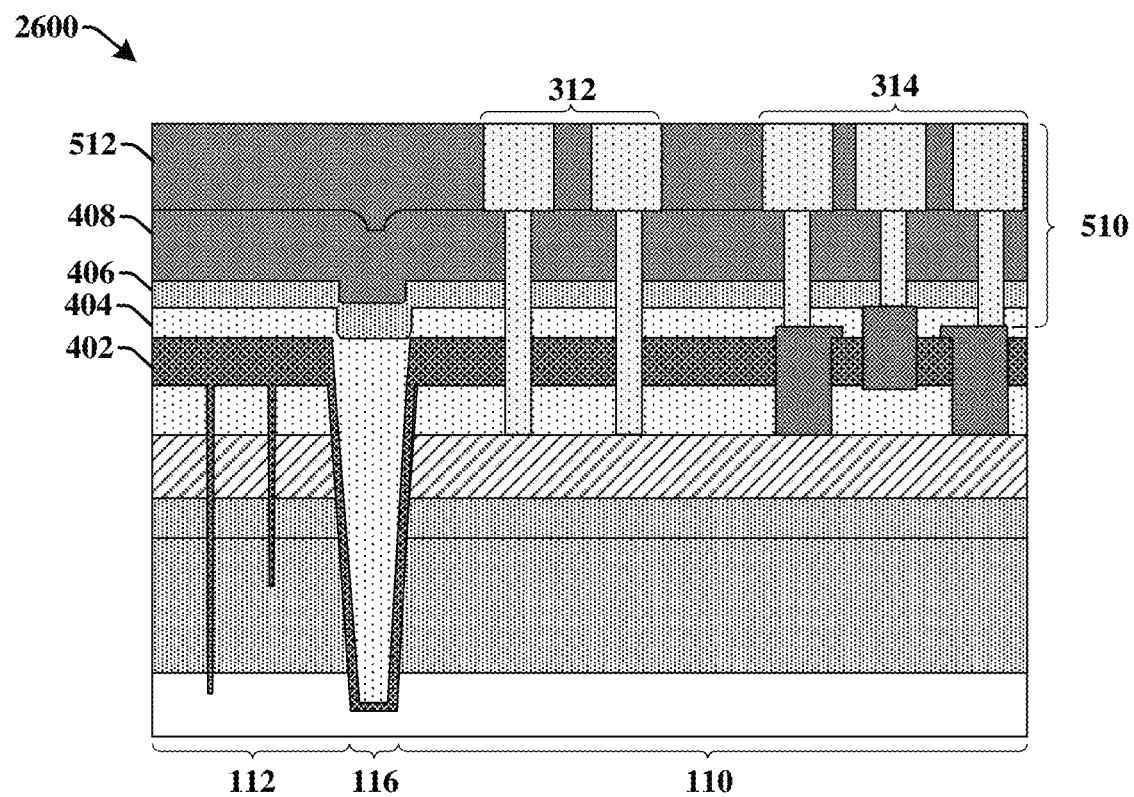

As shown in cross-sectional view 2600 of FIG. 26, a plurality of conductive layers 510 are formed within the plurality of dielectric materials 402-408 and/or the upper ILD layer 512. In some embodiments, the plurality of conductive layers 510 may comprise interconnects formed by way of a damascene process and/or a dual damascene process. In some such embodiments, the upper ILD layer 512 is etched to form holes and/or trenches, which are subsequently filled with a conductive material (e.g., tungsten, copper, and/or aluminum). A chemical mechanical planarization (CMP) process is subsequently performed to remove excess of the conductive material from over the upper ILD layer 512.

Figure 27:
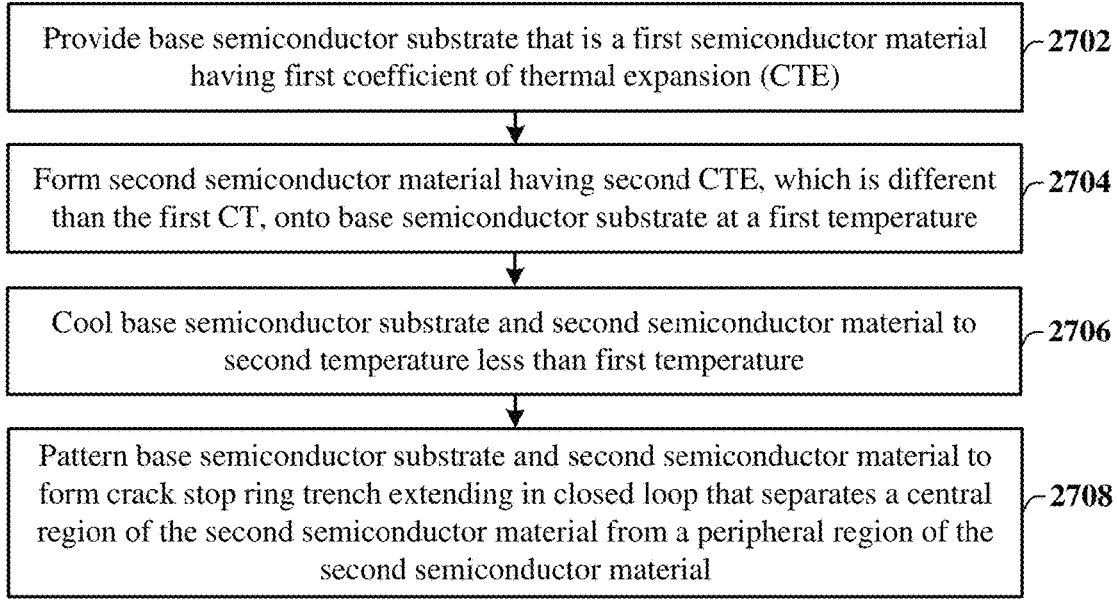
FIG. 27 illustrates a flow diagram of some embodiments of a method of forming a semiconductor structure comprising a crack stop ring trench configured to mitigate the propagation of cracks within a stacked semiconductor substrate.

FIG. 27 illustrates a flow diagram of some embodiments of a method 2700 of forming a semiconductor structure comprising a crack stop ring trench configured to mitigate the propagation of cracks within a stacked semiconductor substrate.

While the disclosed methods (e.g., methods 2700 and 2800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2702, a base semiconductor substrate that is a first semiconductor material having a first coefficient of thermal expansion (CTE) is provided. In some embodiments, the first semiconductor material may be silicon. FIG. 8 illustrates a cross-sectional view 800 of some embodiments corresponding to act 2702.

At act 2704, a second semiconductor material having a second CTE, which is different than the first CTE, is formed onto the base semiconductor substrate at a first temperature. In some embodiments, the second semiconductor material may be a group III-nitride (III-N) semiconductor material. FIG. 9 illustrates a cross-sectional view 900 of some embodiments corresponding to act 2704.

At act 2706, the base semiconductor substrate and the second semiconductor material are cooled to a second temperature that is less than the first temperature. FIGS. 13-14 illustrate cross-sectional views 1300-1400 of some embodiments corresponding to act 2706.

At act 2708, the base semiconductor substrate and the second semiconductor material are patterned to define a crack stop ring trench extending in a closed loop that separates a central region of the second semiconductor material from a peripheral region of the second semiconductor material. FIG. 15 illustrates a cross-sectional view 1500 of some embodiments corresponding to act 2708.

Figure 28:
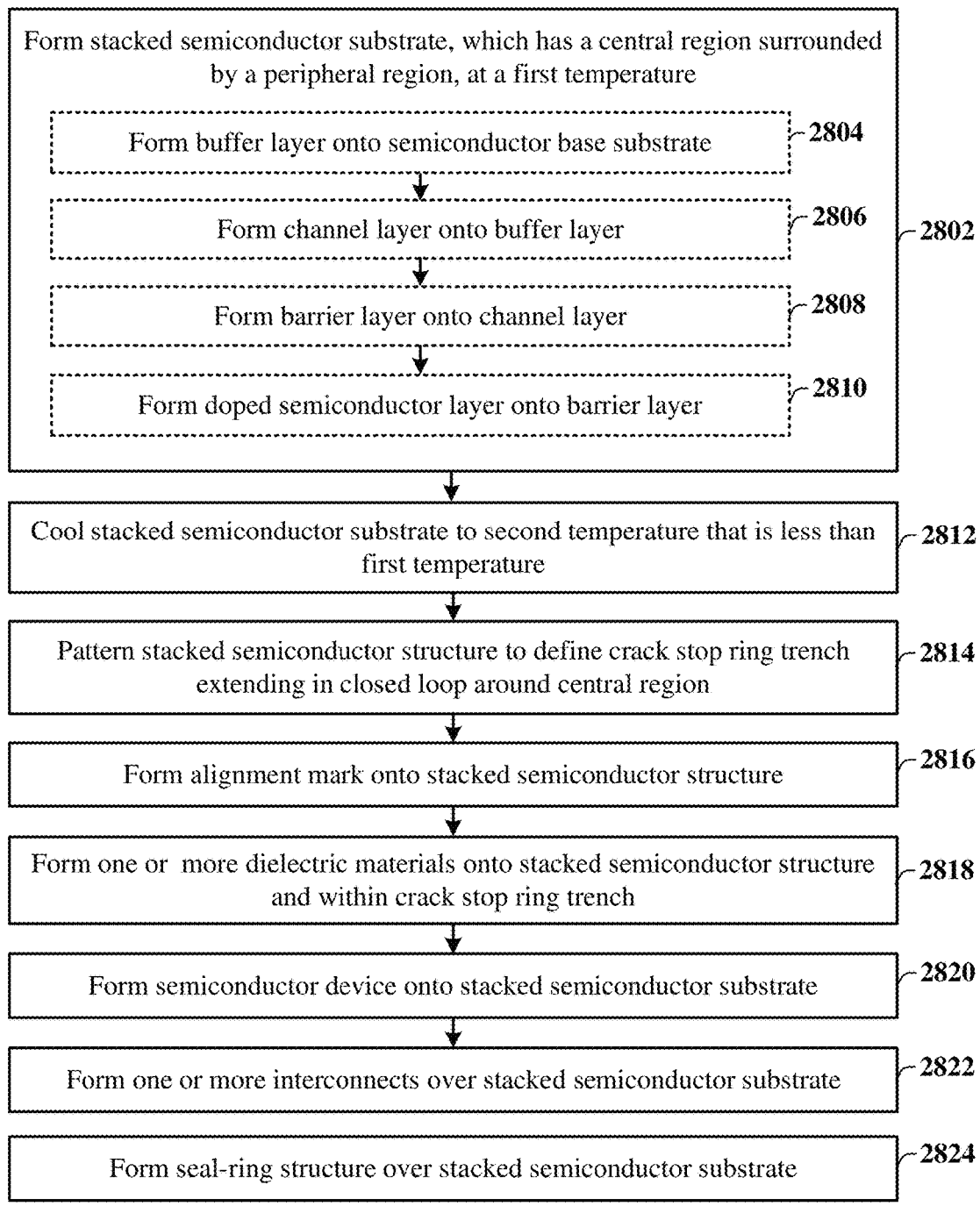
FIG. 28 illustrates a flow diagram of some additional embodiments of a method of forming a semiconductor structure comprising a crack stop ring trench configured to mitigate the propagation of cracks within a stacked semiconductor substrate.

FIG. 28 illustrates a flow diagram of some additional embodiments of a method 2800 of forming a semiconductor structure comprising a crack stop ring trench configured to mitigate the propagation of cracks within a stacked semiconductor substrate.

At act 2802, a stacked semiconductor substrate, which has a central region surrounded by a peripheral region, is formed at a first temperature. In some embodiments, the stacked semiconductor substrate may be formed according to acts 2804-2810.

At act 2804, a buffer layer is formed onto a base semiconductor substrate. FIG. 9 illustrates a cross-sectional view 900 of some embodiments corresponding to act 2804.

At act 2806, an active layer is formed onto the buffer layer. FIG. 10 illustrates a cross-sectional view 1000 of some embodiments corresponding to act 2806.

At act 2808, a barrier layer is formed onto the active layer. FIG. 11 illustrates a cross-sectional view 1100 of some embodiments corresponding to act 2808.

Figure 12:
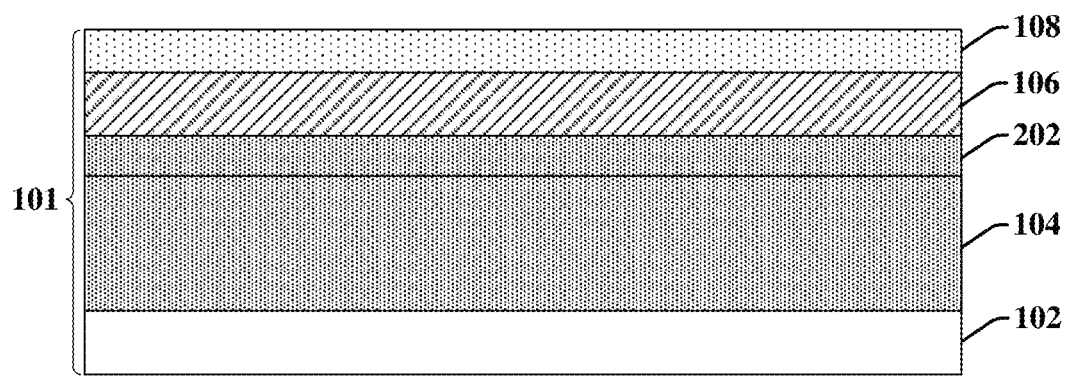

At act 2810, a doped semiconductor layer is formed onto the barrier layer. FIG. 12 illustrates a cross-sectional view 1200 of some embodiments corresponding to act 2810.

At act 2812, the stacked semiconductor substrate is cooled to a second temperature that is less than the first temperature. FIGS. 13-14 illustrate cross-sectional views 1300-1400 corresponding to act 2812.

At act 2814, stacked semiconductor substrate is patterned to define a crack stop ring trench extending in closed loop around the central region. FIG. 15 illustrates a cross-sectional view 1500 of some embodiments corresponding to act 2814.

At act 2816, an alignment mark is formed onto the stacked semiconductor substrate. FIG. 16 illustrates a cross-sectional view 1600 of some embodiments corresponding to act 2816.

At act 2818, one or more dielectric materials are formed onto the stacked semiconductor substrate and within the crack stop ring trench. FIGS. 17, 20, and 23-25 illustrate cross-sectional views 1700, 2000, 2300-2500 of some embodiments corresponding to act 2818.

At act 2820, a semiconductor device is formed onto the stacked semiconductor substrate. FIGS. 18-22 illustrate cross-sectional views 1800-2200 of some embodiments corresponding to act 2820.

At act 2822, one or more interconnects are formed over the stacked semiconductor substrate. FIGS. 23-27 illustrate cross-sectional views 2300-2700 of some embodiments corresponding to act 2822.

At act 2824, a seal-ring structure is formed over the stacked semiconductor substrate. FIGS. 23-27 illustrate cross-sectional views 2300-2700 of some embodiments corresponding to act 2824.

Accordingly, in some embodiments, the present disclosure relates to a semiconductor structure comprising a stacked semiconductor substrate having a crack stop ring trench configured to mitigate the propagation of cracks within a stacked semiconductor substrate. The crack stop ring trench is configured to prevent a plurality of cracks from propagating from a peripheral region of the stacked semiconductor substrate to device regions within a central region of the stacked semiconductor substrate, thereby improving a yield, reliability, and/or performance of devices within the device regions.

In some embodiments, the present disclosure relates to a semiconductor structure, including a stacked semiconductor substrate including a semiconductor material disposed over a base semiconductor substrate, the base semiconductor substrate having a first coefficient of thermal expansion and the semiconductor material having a second coefficient of thermal expansion that is different than the first coefficient of thermal expansion; the stacked semiconductor substrate including one or more sidewalls defining a crack stop ring trench that continuously extends in a closed path between a central region of the stacked semiconductor substrate and a peripheral region of the stacked semiconductor substrate surrounding the central region; and the peripheral region of the stacked semiconductor substrate including a plurality of cracks and the central region is substantially devoid of cracks. In some embodiments, the central region includes a plurality of device regions respectively having one or more semiconductor devices. In some embodiments, the plurality of cracks respectively and continuously extend from an outermost edge of the stacked semiconductor substrate to an end that is separated from the central region by the crack stop ring trench. In some embodiments, the crack stop ring trench includes a substantially circular trench. In some embodiments, the base semiconductor substrate includes a silicon wafer and the semiconductor material includes a gallium nitride buffer layer. In some embodiments, the stacked semiconductor substrate further includes a barrier layer having aluminum gallium nitride disposed over the gallium nitride buffer layer. In some embodiments, the crack stop ring trench is defined by sidewalls of the semiconductor material and sidewalls of the base semiconductor substrate. In some embodiments, the semiconductor structure further includes one or more dielectric materials disposed within the crack stop ring trench, the one or more dielectric materials continuously extending from within the crack stop ring trench to over the stacked semiconductor substrate. In some embodiments, the central region includes a plurality of die regions that are separated from one another by one or more scribe lines that are configured to be removed during singulation of the stacked semiconductor substrate.

In other embodiments, the present disclosure relates to a semiconductor structure including a stacked semiconductor substrate having a buffer layer including a first semiconductor material disposed over a base semiconductor substrate including a second semiconductor material, the stacked semiconductor substrate includes a central region having a plurality of die regions and a peripheral region surrounding the central region; a semiconductor device is disposed over the stacked semiconductor substrate and within a device region of one of the plurality of die regions; a first plurality of dielectric materials are disposed within a crack stop ring trench defined by sidewalls of the stacked semiconductor substrate, a first angle separates a first line extending along a diameter of the stacked semiconductor substrate and one of the sidewalls of the stacked semiconductor substrate; the stacked semiconductor substrate has crack sidewalls defining a plurality of cracks between an outermost edge of the stacked semiconductor substrate and the crack stop ring trench, the first line is separated from a second line extending along a nearest one of the plurality of cracks by a second angle that is smaller than the first angle; and a second plurality of dielectric materials are disposed within the plurality of cracks, the first plurality of dielectric materials including more dielectric materials than the second plurality of dielectric materials. In some embodiments, the second plurality of dielectric materials includes an oxide. In some embodiments, the plurality of die regions respectively include a seal-ring structure extending in a second closed path around the device region. In some embodiments, the crack stop ring trench has a width that is in a range of between approximately 3 microns and approximately 4 microns. In some embodiments, the peripheral region continuously extends along a straight line for a width that is in a range of between approximately 1% and approximately 3% of the diameter of the stacked semiconductor substrate. In some embodiments, one or more of the first plurality of dielectric materials extends into the base semiconductor substrate. In some embodiments, the base semiconductor substrate is a silicon and the buffer layer is gallium nitride. In some embodiments, the crack stop ring trench extends into one or more of the plurality of die regions.

In yet other embodiments, the present disclosure relates to a method of forming a semiconductor structure, including forming a group III-nitride (III-N) semiconductor material over a base silicon substrate at a first temperature; cooling the III-N semiconductor material and the base silicon substrate to a second temperature that is less than the first temperature, cooling the III-N semiconductor material and the base silicon substrate causing a plurality of cracks to form within a peripheral region of the III-N semiconductor material, the peripheral region of the III-N semiconductor material surrounding a central region of the III-N semiconductor material; and etching the III-N semiconductor material and the base silicon substrate to form a crack stop ring trench that extends around the central region of the III-N semiconductor material, the crack stop ring trench separating the central region of the III-N semiconductor material from the peripheral region of the III-N semiconductor material. In some embodiments, the central region is substantially devoid of cracks within the III-N semiconductor material. In some embodiments, the plurality of cracks continuously extend from an outermost edge of the III-N semiconductor material to the crack stop ring trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a stacked semiconductor substrate comprising a semiconductor material disposed over a base semiconductor substrate, wherein the base semiconductor substrate has a first coefficient of thermal expansion and the semiconductor material has a second coefficient of thermal expansion that is different than the first coefficient of thermal expansion;
wherein the stacked semiconductor substrate comprises one or more sidewalls defining a crack stop ring trench that continuously extends in a closed path between a central region of the stacked semiconductor substrate and a peripheral region of the stacked semiconductor substrate surrounding the central region; and
wherein the peripheral region of the stacked semiconductor substrate comprises a plurality of cracks and the central region is substantially devoid of cracks.

2. The semiconductor structure of claim 1, wherein the central region comprises a plurality of device regions respectively comprising one or more semiconductor devices.

3. The semiconductor structure of claim 1, wherein the plurality of cracks respectively and continuously extend from an outermost edge of the stacked semiconductor substrate to an end that is separated from the central region by the crack stop ring trench.

4. The semiconductor structure of claim 1, wherein the crack stop ring trench comprises a substantially circular trench.

5. The semiconductor structure of claim 1, wherein the base semiconductor substrate comprises a silicon wafer and the semiconductor material comprises a gallium nitride buffer layer.

6. The semiconductor structure of claim 5, wherein the stacked semiconductor substrate further comprises a barrier layer including aluminum gallium nitride disposed over the gallium nitride buffer layer.

7. The semiconductor structure of claim 1, wherein the crack stop ring trench is defined by sidewalls of the semiconductor material and sidewalls of the base semiconductor substrate.

8. The semiconductor structure of claim 1, further comprising:
one or more dielectric materials disposed within the crack stop ring trench, wherein the one or more dielectric materials continuously extend from within the crack stop ring trench to over the stacked semiconductor substrate.

9. The semiconductor structure of claim 1, wherein the central region comprises a plurality of die regions that are separated from one another by one or more scribe lines that are configured to be removed during singulation of the stacked semiconductor substrate.

10. A semiconductor structure, comprising:
a stacked semiconductor substrate comprising a buffer layer including a first semiconductor material disposed over a base semiconductor substrate including a second semiconductor material, wherein the stacked semiconductor substrate comprises a central region having a plurality of die regions and a peripheral region surrounding the central region;
a semiconductor device disposed over the stacked semiconductor substrate and within a device region of one of the plurality of die regions;
a first plurality of dielectric materials disposed within a crack stop ring trench formed by sidewalls of the stacked semiconductor substrate, wherein a first angle separates a first line extending along a diameter of the stacked semiconductor substrate and one of the sidewalls of the stacked semiconductor substrate;
wherein the stacked semiconductor substrate comprises crack sidewalls forming a plurality of cracks between an outermost edge of the stacked semiconductor substrate and the crack stop ring trench, the first line being separated from a second line extending along a nearest one of the plurality of cracks by a second angle that is smaller than the first angle; and
wherein a second dielectric material is disposed within the plurality of cracks.

11. The semiconductor structure of claim 10, wherein the second dielectric material comprises an oxide.

12. The semiconductor structure of claim 10, wherein the plurality of die regions respectively comprise a seal-ring structure extending in a second closed path around the device region.

13. The semiconductor structure of claim 10, wherein the crack stop ring trench has a width that is in a range of between approximately 3 microns and approximately 4 microns.

14. The semiconductor structure of claim 10, wherein the peripheral region continuously extends along a straight line for a width that is in a range of between approximately 1% and approximately 3% of the diameter of the stacked semiconductor substrate.

15. The semiconductor structure of claim 10, wherein one or more of the first plurality of dielectric materials extend into the base semiconductor substrate.

16. The semiconductor structure of claim 10, wherein the base semiconductor substrate is silicon and the buffer layer is gallium nitride.

17. The semiconductor structure of claim 10, wherein the crack stop ring trench extends into one or more of the plurality of die regions.

18. A semiconductor structure, comprising:
a base semiconductor substrate;
a semiconductor material disposed over the base semiconductor substrate; and
wherein sidewalls of the base semiconductor substrate and the semiconductor material form a crack stop ring trench that continuously extends along a closed path, the crack stop ring trench being disposed between a central region of the semiconductor material and a peripheral region of the semiconductor material surrounding the central region.

19. The semiconductor structure of claim 18, further comprising:
a plurality of cracks arranged within the peripheral region of the semiconductor material, wherein the crack stop ring trench separates the plurality of cracks from the central region of the semiconductor material.

20. The semiconductor structure of claim 18, further comprising:
one or more dielectric materials disposed within the crack stop ring trench.

* * * * *